(12) United States Patent
Nguyen

(10) Patent No.: US 9,054,916 B1
(45) Date of Patent: Jun. 9, 2015

(54) CONFIGURABLE RECEIVER

(71) Applicant: Rambus Inc., Sunnyvale, CA (US)

(72) Inventor: Huy M. Nguyen, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 47 days.

(21) Appl. No.: 13/858,916

(22) Filed: Apr. 8, 2013

Related U.S. Application Data

(60) Provisional application No. 61/623,919, filed on Apr. 13, 2012.

(51) Int. Cl.
*H04L 25/06* (2006.01)
*H03K 3/012* (2006.01)
*H04L 25/02* (2006.01)

(52) U.S. Cl.
CPC .............. *H04L 25/066* (2013.01); *H03K 3/012* (2013.01); *H04L 25/0274* (2013.01)

(58) Field of Classification Search
CPC ......................... H04L 25/0274; H04L 25/0276
See application file for complete search history.

(56) References Cited

U.S. PATENT DOCUMENTS

| 6,583,946 | B1 * | 6/2003 | Emerson | 360/66 |
| 6,775,328 | B1 * | 8/2004 | Segaram | 375/257 |
| 7,660,350 | B2 * | 2/2010 | Hsu et al. | 375/226 |
| 2003/0034839 | A1 * | 2/2003 | Poggi et al. | 330/132 |
| 2006/0119435 | A1 * | 6/2006 | Oh et al. | 330/311 |
| 2008/0159188 | A1 * | 7/2008 | Funagai | 370/298 |
| 2009/0051576 | A1 * | 2/2009 | Dedic et al. | 341/136 |
| 2012/0132821 | A1 * | 5/2012 | Kuwabara | 250/370.08 |

OTHER PUBLICATIONS

Wu, Wanhua et al., "A 0.8-2.5 GHz wideband CMOS LNA with ESD protection for multimode receivers," Proceedings of the 19th Annual Workshop on Circuits, Systems and Signal Processing (ProRisc), 2008, pp. 283-286. 4 pages.

* cited by examiner

*Primary Examiner* — Santiago Garcia
(74) *Attorney, Agent, or Firm* — The Neudeck Law Firm, LLC

(57) ABSTRACT

A receiver that is selectively reconfigurable in a first and a second selectable configuration is disclosed. Configured in the first selectable configuration, the receiver may provide a low impedance input. Configured in the first selectable configuration, a low common-mode input signal may be received. In an embodiment, configured in the first selectable configuration, signaling technologies, such as a Near Ground Signaling (NGS) may be received. Configured in the second selectable configuration, the receiver may provide a high impedance input. Configured in the second selectable configuration, a high common-mode input signal may be received. In an embodiment, configured in the second selectable configuration, signaling technologies, such as a Low Voltage Differential Signaling (LVDS), Pseudo Open Drain Logic (PODL) signaling, Differential Rambus Signaling Level (DRSL), and/or Series Stub Terminated Logic (SSTL) signaling may be received.

20 Claims, 14 Drawing Sheets

CONFIGURABLE RECEIVER

DETAILED DESCRIPTION

Figure 1:
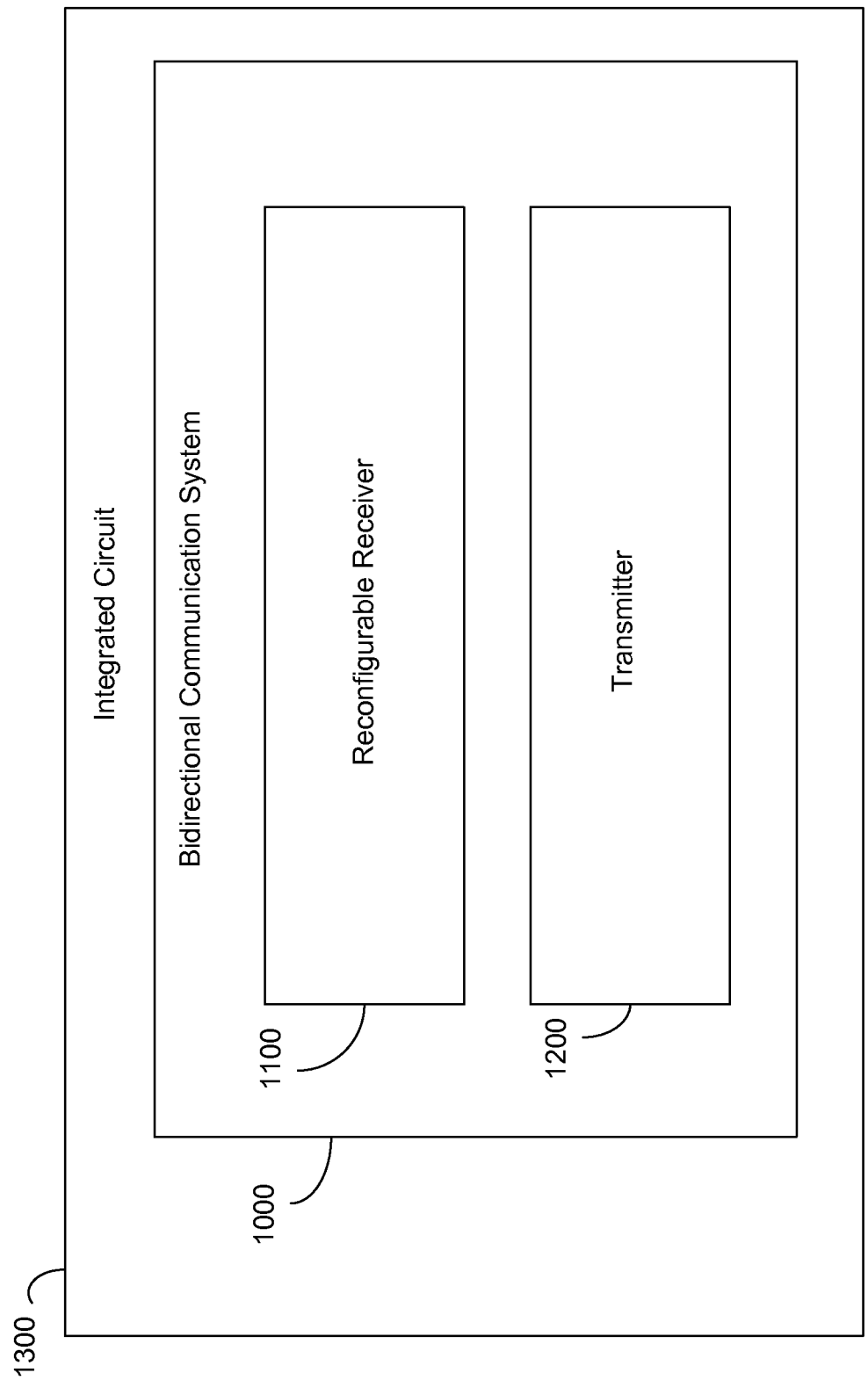
FIG. 1 is a block diagram illustrating an embodiment of a bidirectional communication system.

In an embodiment, a receiver may be selectively reconfigurable. The receiver may be configured in a first selectable configuration or a second selectable configuration. Configured in the first selectable configuration, the receiver may provide a low impedance input. Configured in the first selectable configuration, a low common-mode voltage input signal may be received. For example, configured in the first selectable configuration, signaling technologies such as a Near Ground Signaling (NGS) may be received.

Configured in the second selectable configuration, the receiver may provide a high impedance input. Configured in the second selectable configuration, a high common-mode voltage input signal may be received. For example, configured in the second selectable configuration, signaling technologies such as a Low Voltage Differential Signaling (LVDS), Pseudo Open Drain Logic (PODL) signaling, Differential Rambus Signaling Level (DRSL), and/or Series Stub Terminated Logic (SSTL) signaling may be received. Also, while configured in the second selectable configuration Double Data Rate type four (DDR4) signaling, Double Data Rate type five (DDR5) signaling, Graphics Double Data Rate type four (GDDR4) signaling, Graphics Double Data Rate type seven (GDDR7) signaling, Low Power Double Data Rate type three (LPDDR3) signaling, Low Power Double Data Rate type four (LPDDR4) signaling and/or eXtreme Data Rate (XDR) signaling may be received.

Signaling technologies such as Near Ground Signaling may have a near ground, low voltage swing. For example, Near Ground Signaling may have a near ground, low voltage swing between approximately eighty-five millivolts (85 mV) and approximately one-hundred and fifteen millivolts (115 mV). Near Ground Signaling may have a low common-mode voltage of, for example, approximately one-hundred millivolts (100 mV). A common-mode voltage that is less than a threshold voltage (of a transistor used to receive the signal) above a negative supply voltage to which the common-mode voltage is referenced may be considered a low common-mode voltage.

Signaling technologies may employ near-VDD signaling. For example, near-VDD signaling may swing between approximately eight-hundred-and-eighty-five millivolts (885 mV) and approximately nine-hundred-and-fifteen millivolts (915 mV). Near-VDD signaling may have a high common-mode voltage of, for example, approximately nine-hundred millivolts (900 mV). Other signaling technologies with other common-mode voltages (such as $V_{DD}/2$, 1.5V, etc.), and other voltage swings may be employed. A common-mode voltage that is more than a threshold voltage (of a transistor used to receive the signal) above a negative supply voltage to which the common-mode voltage is referenced may be considered a high common-mode voltage.

Signaling technologies such as Near Ground Signaling may substantially reduce receiver power consumption relative to other technologies. For example, a low common-mode voltage (e.g., approximately 100 mV) may substantially reduce receiver power consumption relative to a high common-mode voltage (e.g., approximately 900 mV.) Designs incorporating a selectively reconfigurable receiver may be compatible with multiple signaling technologies.

FIG. 1 is a block diagram illustrating an embodiment of an integrated circuit 1300. Integrated circuit 1300 may include a bidirectional communication system 1000. Bidirectional communication system 1000 may comprise a reconfigurable receiver 1100 and a transmitter 1200.

Figure 2:
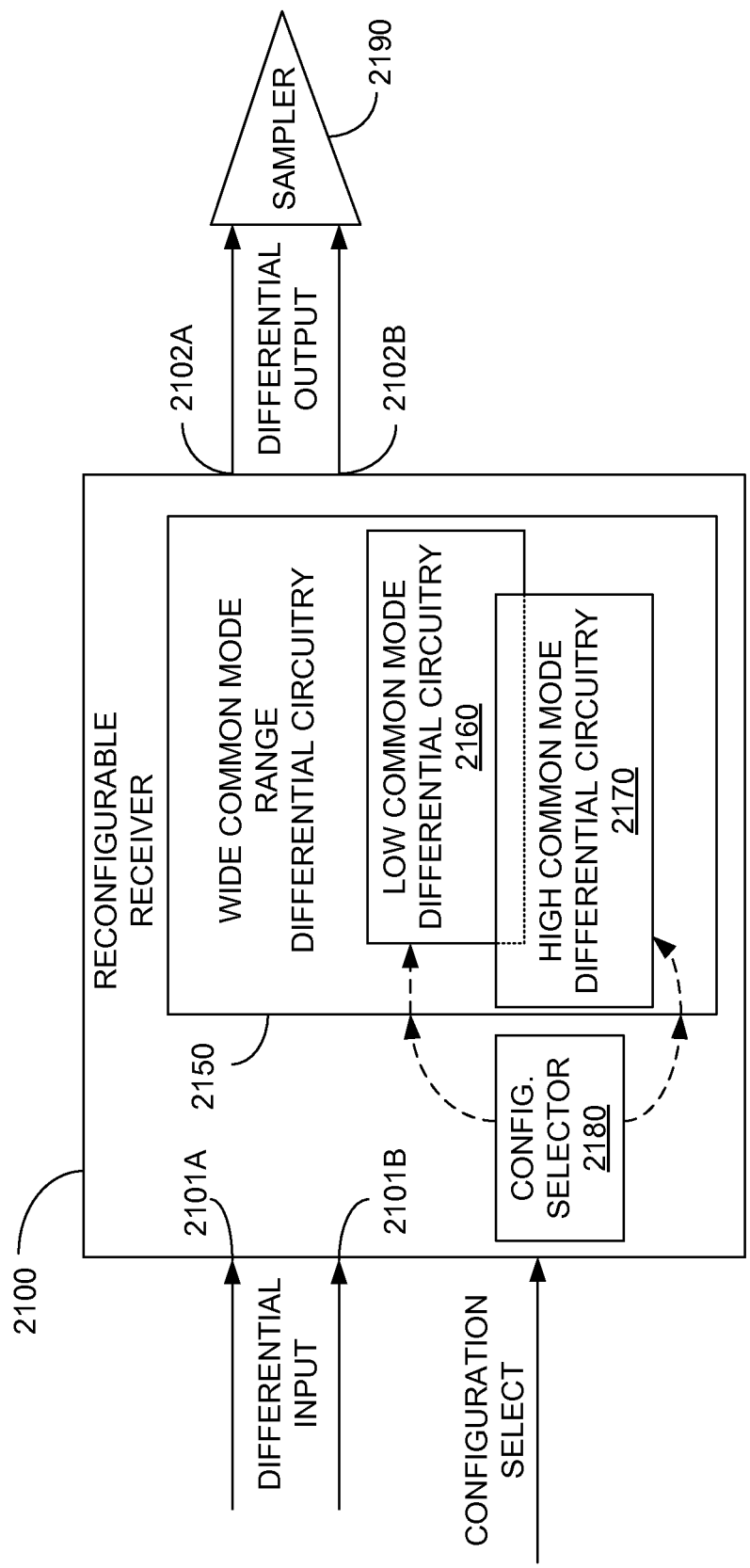
FIG. 2 is a block diagram illustrating an embodiment of a selectively reconfigurable receiver.

FIG. 2 is a block diagram illustrating an embodiment of a reconfigurable receiver 2100. Reconfigurable receiver 2100 may include, but is not limited to, wide common-mode range differential circuitry 2150. Wide common-mode range differential circuitry 2150 may comprise low common-mode differential circuitry 2160 and high common-mode differential circuitry 2170. Low common-mode differential circuitry 2160 and high common-mode differential circuitry 2170 may share some circuit elements. Reconfigurable receiver 2100 may further comprise configuration selector 2180. Configuration selector 2180 may be coupled to wide common-mode range differential circuitry 2150. Configuration selector 2180 may be coupled to low common-mode differential circuitry 2160 and/or to high common-mode differential circuitry 2170. Configuration selector 2180 may be coupled to low common-mode differential circuitry 2160 and/or to high common-mode differential circuitry 2170 for selective activation of low common-mode differential circuitry 2160 and/or high common-mode differential circuitry 2170.

Selective activation of low common-mode differential circuitry 2160 and/or high common-mode differential circuitry 2170 may be in response to configuration select signals. In other words, when reconfigurable receiver 2100 is in a first configuration, the active circuitry of reconfigurable receiver 2100 may enable low common-mode differential circuitry 2160. When reconfigurable receiver 2100 is in a second configuration, the active circuitry of reconfigurable receiver 2100 may enable high common-mode differential circuitry 2170. When reconfigurable receiver 2100 is in a third configuration, the active circuitry of reconfigurable receiver 2100 may enable both low-common mode differential circuitry 2160 and high common-mode differential circuitry 2170. A differential output signal of reconfigurable receiver 2100 may be sampled by a sampler 2190.

In an embodiment, in response to first configuration select signal levels, (e.g., one of a logic "1" or "0" at two or more configuration select inputs) configuration selector 2180 may select a first configuration for wide common-mode range differential circuitry 2150. These first configuration select signal levels enable low common-mode differential circuitry 2160. When enabled, low common-mode differential circuitry 2160 can receive a low common-mode differential input signal, and produces the differential output signal of reconfigurable receiver 2100. The low common-mode input signal is received at input nodes 2101A, 2101B of reconfigurable receiver 2100. The differential output signal is provided at output nodes 2102A, 2102B of reconfigurable receiver 2100.

In response to the first configuration select signal levels, configuration selector 2180 deactivates high common-mode differential circuitry 2170. When deactivated, high common-mode differential circuitry 2170 substantially avoids contributing to the differential output signal of reconfigurable receiver 2100.

Second configuration select signal levels may be applied to reconfigurable receiver 2100. In response to the second configuration select signal levels, configuration selector 2180 selects a second configuration of the wide common-mode range differential circuitry 2150. These second configuration select signal levels enable high common-mode differential receiver circuitry 2170. When enabled, high common-mode differential circuitry 2170 can receive a high common-mode differential input signal, and produces the differential output signal of reconfigurable receiver 2100. The high common-mode input signal is received at input nodes 2101A, 2101B of reconfigurable receiver 2100. The differential output signal is provided at output nodes 2102A, 2102B of reconfigurable receiver 2100.

In response to the second configuration select signal levels, configuration selector 2180 deactivates low common-mode differential circuitry 2160. When deactivated, low common-mode differential circuitry 2160 substantially avoids contributing to the differential output signal of reconfigurable receiver 2100.

Third configuration select signal levels may be applied to reconfigurable receiver 2100. In response to the third configuration select signal levels, configuration selector 2180 selects a third configuration of the wide common-mode range differential circuitry 2150. These second configuration select signal levels enable low common-mode differential receiver circuitry 2160 and enable high common-mode differential receiver circuitry 2170. When in this third mode, low common-mode differential receiver circuitry 2160 and high common-mode differential circuitry 2170 can receive a low common-mode differential input signal and/or a high common-mode differential input signal, and produces the differential output signal of reconfigurable receiver 2100. The high or low common-mode input signal is received at input nodes 2101A, 2101B of reconfigurable receiver 2100. The differential output signal is provided at output nodes 2102A, 2102B of reconfigurable receiver 2100.

In other words, FIG. 2 shows a reconfigurable receiver 2100 that is selectively configurable in a plurality of configurations. These configurations may activate and deactivate low common-mode differential circuitry 2160 and/or high common-mode differential circuitry 2170. Low common-mode differential circuitry 2160 may comprise a first type of single-stage differential amplifier or receiver. High common-mode differential circuitry 2170 may comprise a second type of single-stage differential amplifier or receiver. For example, low common-mode differential circuitry 2160 may comprise a common-gate type amplifier/receiver. High common-mode differential circuitry may comprise a common-source type amplifier/receiver.

Differential input nodes 2101A, 2101B may couple to low common-mode circuitry 2160 in a first configuration of reconfigurable receiver 2100. Differential input nodes 2101A, 2101B may couple to high common-mode differential amplifier circuitry 2170 in the second configuration of reconfigurable receiver 2100. When reconfigurable receiver 2100 is in the first configuration or third configuration, differential output nodes 2102A, 2102B may be coupled to a level shifting function of low common-mode differential circuitry 2160. When reconfigurable receiver 2100 is in the second configuration or the third configuration, differential output nodes 2102A, 2102B may be coupled to a level shifting function of high common-mode differential amplifier circuitry 2170. It should also be understood that differential input nodes 2101A, 2101B may receive single-ended signaling. In this case, a single-ended signal can be received at one of differential input nodes 2101A, 2101B and the other of differential input nodes 2101A, 2101B receives a reference signal (e.g., $V_{REF}$) and the difference between the single-ended signaling signal and the reference signal form a differential input signal at nodes 2101A, 2101B.

Configuration selector 2180 controls reconfigurable receiver 2100 to alternatively select at least one of the first configuration of reconfigurable receiver 2100, the second configuration of reconfigurable receiver 2100, and the third configuration of reconfigurable receiver 2100. In particular, when reconfigurable receiver 2100 is in the first configuration, configuration selector 2180 controls low common-mode differential circuitry 2160 and high common-mode differential circuitry 2170 such that low common-mode differential circuitry 2160 is activated and high common-mode differential circuitry 2170 is deactivated. When reconfigurable receiver 2100 is in the second configuration, configuration selector 2180 controls low common-mode differential circuitry 2160 and high common-mode differential circuitry 2170 such that low common-mode differential circuitry 2160 is deactivated and high common-mode differential circuitry 2170 is activated. When reconfigurable receiver 2100 is in the third configuration, configuration selector 2180 controls low common-mode differential circuitry 2160 and high common-mode differential circuitry 2170 such that low common-mode differential circuitry 2160 is activated and high common-mode differential circuitry 2170 is activated. Circuit elements shared between low common-mode differential circuitry 2160 and high common-mode differential circuitry 2170 may be active regardless of the configuration of reconfigurable receiver 2100. However, the shared circuit elements between low common-mode differential circuitry 2160 and high common-mode differential circuitry 2170 may perform different functions depending on which of low common-mode differential circuitry 2160 and high common-mode differential circuitry 2170, or both, is activated and/or deactivated.

When configuration selector 2180 controls low common-mode differential circuitry 2160 and high common-mode differential circuitry 2170 such that both low common-mode differential circuitry 2160 and high common-mode differential circuitry 2170 are activated, reconfigurable receiver 2100 may receive signals with either a low common-mode or a high common-mode. Thus, this configuration is useful when the common-mode of the signaling at differential input nodes 2101A, 2101B is not known in advance.

Figure 3:
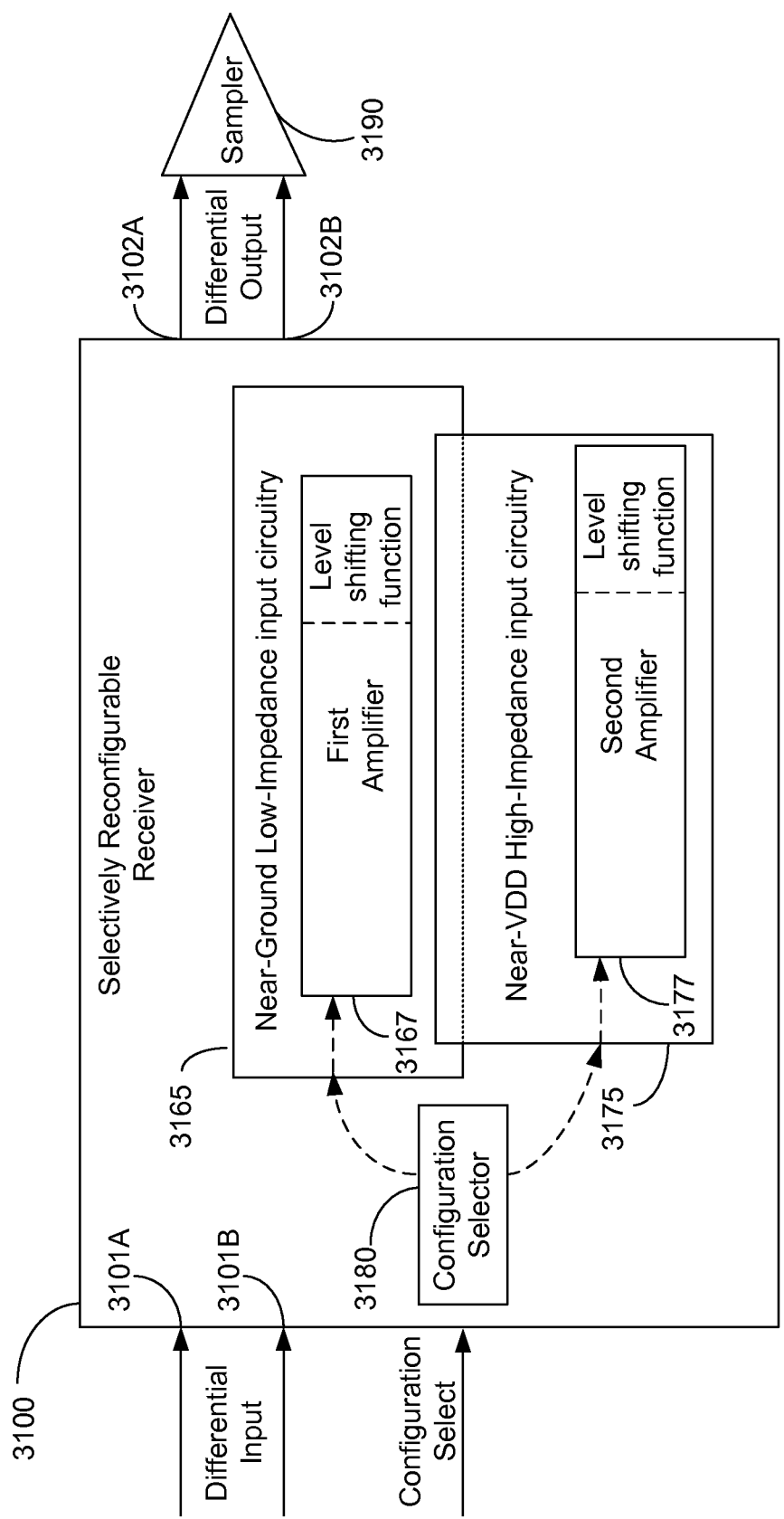
FIG. 3 is a block diagram illustrating a receiver embodiment.

FIG. 3 is a block diagram illustrating a receiver embodiment 3100, which may include, but is not limited to, near-ground low-impedance input circuitry 3165 and near-VDD high-impedance input circuitry 3175. Near-ground low-impedance input circuitry 3165 may comprise a first amplifier 3167 which includes a level shifting function. First amplifier 3167 may comprise a common-gate type differential amplifier. First amplifier 3167 may be a single-stage amplifier. Near-VDD high-impedance input circuitry 3175 may comprise a second amplifier 3177 which performs a level shifting function. The second amplifier 3177 may comprise a common-source differential amplifier. The second amplifier 3177 may be a second single-stage amplifier.

Reconfigurable receiver 3100 further comprises a configuration selector 3180. Configuration selector 3180 may be coupled to near-ground low-impedance input circuitry 3165 and near-VDD high-impedance input circuitry 3175. More particularly, configuration selector 3180 may be coupled to first amplifier 3167 and second amplifier 3177 to selectively activate and deactivate first amplifier 3167 and/or second amplifier 3177. First amplifier 3167 and second amplifier 3177 may be selectively activated in response to configuration select signal(s). A differential output signal of reconfigurable receiver 3100 may be sampled by a sampler 3190.

In an embodiment, in response to a first configuration select signal level, configuration selector 3180 selects a first configuration of reconfigurable receiver 3100. This activates near-ground low-impedance input circuitry 3165. When activated, near-ground low-impedance input circuitry 3165 (or more particularly, first amplifier 3167) can receive a differential input signal. This differential input signal may be a Near Ground Signaling signal. In response to the differential input signal, near-ground low-impedance input circuitry 3165 (or more particularly, first amplifier 3167) produces a differential output signal of reconfigurable receiver 3100. The level shifting function of first amplifier 3167 may shift a voltage level of the differential output signal, relative to the differential input signal. The level shifting function of first amplifier 3167 may shift a common-mode voltage level of the differential output signal, relative to the common-mode voltage of the differential input signal. A Near Ground Signaling signal can be received at input nodes 3101A, 3101B of reconfigurable receiver 3100. The differential output signal is provided at output nodes 3102A, 3102B of reconfigurable receiver 3100. In other words, when reconfigurable receiver 3100 is in the first configuration, output nodes 3102A, 3102B couple to a level shifting function of first amplifier 3167 so as to provide a differential output signal at output nodes 3102A, 3102B that has a different common-mode voltage than the differential input signal at input nodes 3101A, 3101B.

In response to the first configuration select signal level, configuration selector 3180 may deactivate all or part of near-VDD high-impedance input circuitry 3175. When deactivated, the near-VDD high-impedance input circuitry 3175 (or more particularly, second amplifier 3177) substantially avoids contributing to the differential output signal of reconfigurable receiver 3100.

A second configuration select signal level may be applied to reconfigurable receiver 3100. In response to the second configuration select signal level, configuration selector 3180 selects a second configuration of reconfigurable receiver 3100. This activates near-VDD high-impedance input circuitry 3175. When activated, near-VDD high-impedance input circuitry 3175 (or more particularly, second amplifier 3177) can receive a differential input signal. This differential input signal may be a near-VDD signaling signal. In response to a differential input signal, reconfigurable receiver 3100 produces a differential output signal. The level shifting function of second amplifier 3177 shifts a voltage level of the differential output signal, relative to the near-VDD signaling signal of the differential input signal. The level shifting function of second amplifier 3177 shifts a common-mode voltage of the differential output signal, relative to the common-mode voltage of the differential input signal. The near-VDD signaling signal is received at input nodes 3101A, 3101B of reconfigurable receiver 3100. A differential output signal is provided at output nodes 3102A, 3102B of reconfigurable receiver 3100. In other words, when reconfigurable receiver 3100 is in the second configuration, output nodes 3102A, 3102B couple to the level shifting function of the second amplifier 3177 so as to provide a differential output signal at the output nodes 3102A, 3102B that has a different common-mode voltage than the differential input signal at input nodes 3101A, 3101B.

In response to the second configuration select signal level, configuration selector 3180 may deactivate all or part of near-ground low-impedance input circuitry 3165. When deactivated, near-ground low-impedance input circuitry 3165 (or more particularly, first amplifier 3167) substantially avoids contributing to the differential output signal of reconfigurable receiver 3100.

Figure 4A:
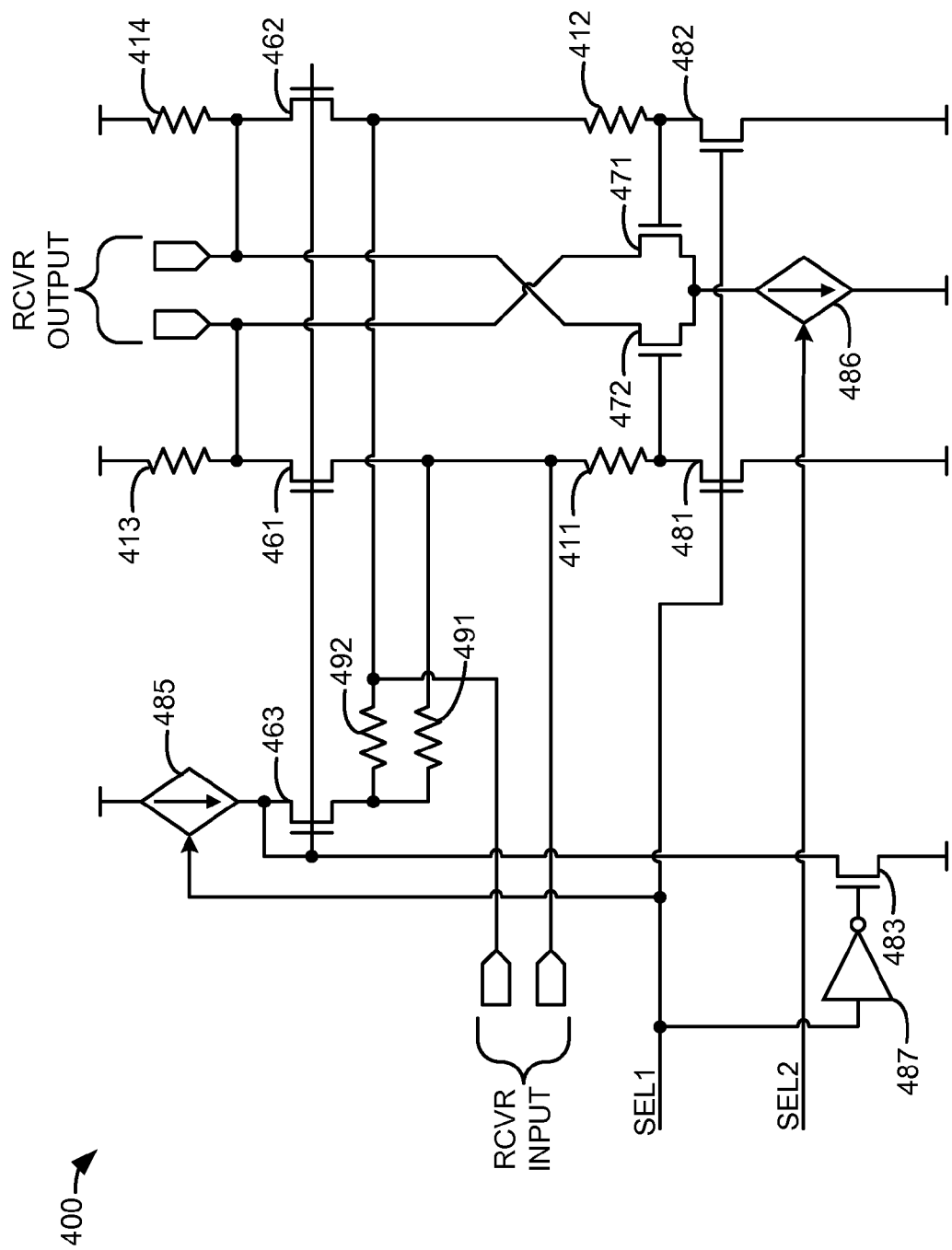
FIG. 4A is a schematic diagram illustrating a reconfigurable receiver.

FIG. 4A is a schematic diagram illustrating a reconfigurable receiver. Reconfigurable receiver 400 comprises resistors 411-414, termination resistors 491-492, re-channel field-effect transistors (FETs) 461-463, 471-472, and 481-483, a current source 485, a current source 486, an inverter 487, and an inverter 488. In FIG. 4A, a first terminal of resistor 414 is connected to a positive power supply terminal. The second terminal of resistor 414 is connected to the drain of FET 462 and the drain of FET 472. The source of FET 462 is connected to a first terminal of resistor 412 and a first terminal of termination resistor 492. The second terminal of resistor 412 is connected to the gate of FET 471 and the drain of FET 482. The source of FET 482 is connected to a negative power supply. The source of FET 472 is connected to the source of FET 471 and a first terminal of current source 486.

A first terminal of resistor 413 is connected to the positive power supply terminal. The second terminal of resistor 413 is connected to the drain of FET 461 and the drain of FET 471. The source of FET 461 is connected to a first terminal of resistor 411 and a first terminal of termination resistor 491. The second terminal of resistor 411 is connected to the gate of FET 472 and the drain of FET 481. The source of FET 481 is connected to the negative power supply terminal. The source of FET 471 is connected to the source of FET 472 and the first terminal of current source 486.

The input of reconfigurable receiver 400 is a differential signal received between the first terminal of resistor 411 and the first terminal of resistor 412 (a.k.a., the source of FET 461 and the source of FET 462, respectively). The output of reconfigurable receiver 400 is a differential signal taken between the second terminal of resistor 413 and the second terminal of resistor 414 (a.k.a., the drain of FET 461 and the drain of FET 462, respectively, or the drain of FET 471 and the drain of FET 472, respectively).

The input of inverter 487 in connected to a to a first configuration select signal, SEL1. The output of inverter 487 is connected to the gate of FET 483. SEL1 is also connected to the control terminal of current source 485, the gate of FET 481, and the gate of FET 482. When SEL1 is in a logic high ("1") state, current source 485 conducts a controlled amount of current from a first terminal to its second terminal. When SEL1 is in a logic low ("0") state, current source 485 conducts no current, and is thus an open circuit. When SEL1 is in a logic high ("1") state, FET 481 and FET 482 are "on". When SEL1 is in a logic low ("0") state, FET 481 and FET 482 are "off" and therefore conduct essentially no current. FET 481 and FET 482 may be calibrated or designed such that when FET 481 and FET 482 are "on" they each have a non-negligible drain-to-source impedance. In an embodiment, the "on" condition drain-to-source impedance of FET 481 and FET 482 are each approximately 500-800Ω. The first terminal of current source 485 is connected to the positive power supply terminal.

The gate of FET 463 is connected to the drain of FET 463, thereby forming a diode-connect FET. The gate of FET 461, the gate of FET 462, the drain of FET 483, and the second terminal of current source 485 are connected to drain and gate terminals of FET 463. The source of FET 463 is connected to the second terminal of termination resistor 491 and the second terminal of termination resistor 492. The source of FET 483 is connected to the negative power supply terminal.

A second configuration select signal, SEL2, is connected to the control terminal of current source 486. The output of inverter 488 is connected to the gate of FET 481 and the gate of FET 482. Thus, when SEL2 is in a logic high ("1") state, current source 486 conducts a controlled amount of current from its first terminal to its second terminal. When SEL2 is in a logic low ("0") state, current source 486 conducts no current, and is equivalent to an open circuit. The first terminal of current source 486 is connected to the source of FET 471 and the source of FET 472. The second terminal of current source 486 is connected to the negative power supply terminal.

When SEL1 is in a logic high ("1") state and SEL2 is in a logic low ("0") state, the following conditions exist: (1) FET 481 and FET 482 are both on; (2) current source 485 is on; (3) FET 483 is off; and, (4) current source 486 is off. With FET 481 and FET 482 both on, and current source 486 is off, the gates of FET 471 and FET 472 are pulled to near the negative supply voltage by FET 482 and FET 481, respectively. This turns FET 471 and FET 472 off.

Figure 4B:
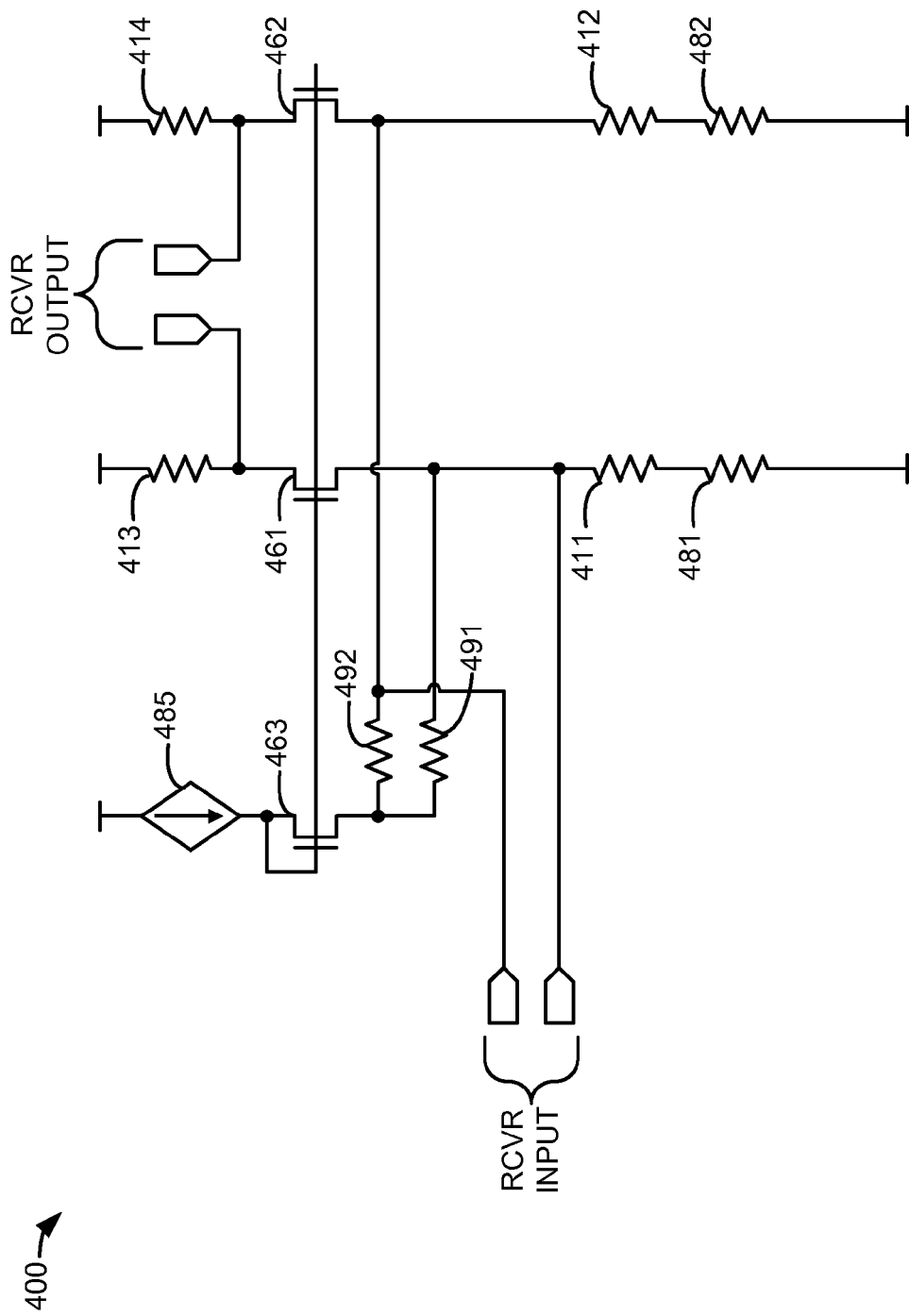
FIG. 4B is a schematic diagram illustrating an equivalent circuit of a reconfigurable receiver in a first configuration.

FIG. 4B is a schematic diagram illustrating the equivalent circuit of reconfigurable receiver 400 when SEL1 is in a logic high state and SEL2 is in a low logic state. In FIG. 4B, the "off" or non-conducting elements of reconfigurable receiver 400 have been removed. With the exception of FET 481 and FET 482, the "on" FETs have been replaced with short circuits. FET 481 and FET 482 are shown as resistors to reflect their "on" state impedances. Also, because they are not in the active signal path from the receiver input to the receiver output, inverter 487 is not shown in FIG. 4B. In FIG. 4B, a first terminal of resistor 414 is connected to the positive power supply terminal. The second terminal of resistor 414 is connected to the drain of FET 462. FET 472 is not shown because it is off. The source of FET 462 is connected to a first terminal of resistor 412 and a first terminal of termination resistor 492. The second terminal of resistor 412 is shown connected to a first terminal of the impedance representing FET 482 because FET 482 is on. The second terminal of the impedance representing FET 482 is connected to the negative power supply. The second terminal of termination resistor 492 is connected to the source of FET 463. Current source 486 is not shown because it is off.

A first terminal of resistor 413 is connected to the positive power supply terminal. The second terminal of resistor 413 is connected to the drain of FET 461. FET 471 is not shown because it is off. The source of FET 461 is connected to a first terminal of resistor 411 and a first terminal of termination resistor 491. The second terminal of resistor 411 is shown connected to a first terminal of the impedance representing FET 481 because FET 481 is on. The second terminal of the impedance representing FET 481 is connected to the negative power supply. The second terminal of termination resistor 491 is connected to the source of FET 463.

Current source 485 is shown conducting a controlled current that is routed through diode-connected FET 463. Thus, the current flowing through current source 485 determines the current flowing through FETs 461 and 462 in a current-mirror-like arrangement. It should be understood from FIG. 4B that in this configuration (i.e., with SEL1 high and SEL2 low), reconfigurable receiver 400 is configured as a differential common-gate type amplifier. Thus, in the configuration shown in FIG. 4B, reconfigurable receiver 400 will have a relatively low input impedance and be well-suited for near ground signaling common-mode input voltages.

Returning to FIG. 4A, when SEL1 is in a logic low ("0") state and SEL2 is in a logic high ("1") state, the following conditions exist: (1) FET 481 and FET 482 are both off; (2) current source 485 is off; (3) FET 483 is on; and, (4) current source 486 is on. With current source 485 off and FET 483 on, the gates of FETs 461-463 are pulled to the negative supply voltage, thus turning FETs 461-463 off.

Figure 4C:
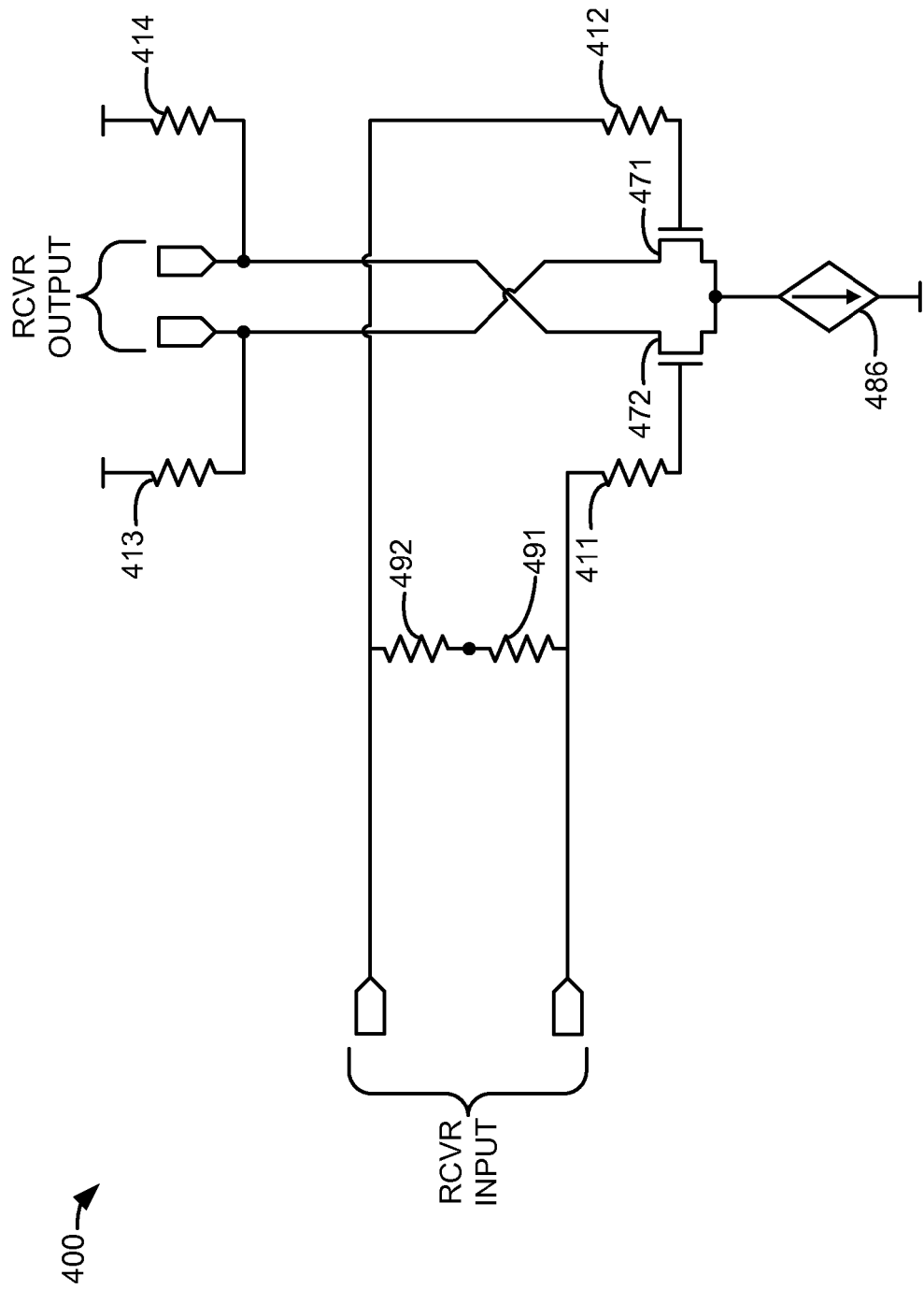
FIG. 4C is a schematic diagram illustrating an equivalent circuit of a reconfigurable receiver in a second configuration.

FIG. 4C is a schematic diagram illustrating the equivalent circuit of reconfigurable receiver 400 when SEL1 is in a low logic low state and SEL2 is in a high logic state. In FIG. 4C, the "off" or non-conducting elements of reconfigurable receiver 400 have been removed and the "on" FETs have been replaced with short circuits. Also, because they are not in the active signal path from the receiver input to the receiver output, inverter 487 and inverter 488 are not shown in FIG. 4C. In FIG. 4C, a first terminal of resistor 414 is connected to the positive power supply terminal. The second terminal of resistor 414 is connected to the drain of FET 472. FET 462 is not shown because it is off. FET 463 is not shown because it is off. A first terminal of resistor 413 is connected to the positive power supply terminal. The second terminal of resistor 413 is connected to the drain of FET 471. FET 461 is not shown because it is off.

The source of FET 471 and the source of FET 472 are connected to the first terminal of current source 486. The second terminal of current source 486 is connected to the negative power supply terminal. A first terminal of resistor 411 is connected to a first one of the differential input terminals of reconfigurable receiver 400. The second terminal of resistor 411 is connected to the gate of FET 472. Thus, resistor 411 provides a resistance between the input of reconfigurable receiver 400 and the gate of FET 472. This resistance may help prevent the gate of FET 472 from suffering damage due to electrostatic discharge (ESD) events. A first terminal of resistor 412 is connected to a second one of the differential input terminals of reconfigurable receiver 400. The second terminal of resistor 412 is connected to the gate of FET 471. Thus, resistor 412 provides a resistance between the input of reconfigurable receiver 400 and the gate of FET 471. This resistance may help prevent the gate of FET 471 from suffering damage due to ESD events. In addition, the presence of FETs 481-482 (off in FIG. 4C, but providing a potential path to ground) may act as secondary ESD protection to help prevent the gates of FETs 471-472 from suffering damage due to ESD events.

A first terminal of termination resistor 491 is connected to the first terminal of resistor 411 (a.k.a., the first one of the differential input terminals of reconfigurable receiver 400). A first terminal of termination resistor 492 is connected to the first terminal of resistor 412 (a.k.a., the second one of the differential input terminals of reconfigurable receiver 400). The second terminal of termination resistor 492 is shown connected to the second terminal of resistor 491. In various embodiments not shown in FIGS. 4A-4D, the second terminals of resistor 491 and resistor 492 can be connected to a termination voltage such as the negative supply voltage, the positive supply voltage, an arbitrary termination voltage ($V_{TERM}$), or a voltage that matches the common-mode voltage of the input signal ($V_{CM}$).

It should be understood from FIG. 4C that in this configuration (i.e., with SEL1 low and SEL2 high), reconfigurable receiver 400 is configured as a differential common-source type amplifier. Thus, in the configuration shown in FIG. 4B, reconfigurable receiver 400 will have relatively high input impedance and be well-suited for near VDD signaling common-mode input voltages.

Returning to FIG. 4A, when SEL1 is in a logic high ("1") state and SEL2 is in a logic high ("1") state, the following conditions exist: (1) FET 481 and FET 482 are both on; (2) current source 485 is on; (3) FET 483 is off; and, (4) current source 486 is on. In this configuration (i.e., with SEL1 high and SEL2 high), reconfigurable receiver 400 is configured as both a differential common-source type amplifier and a differential common-gate type amplifier that sum their result at the same summing nodes (i.e., the receiver output).

Figure 4D:
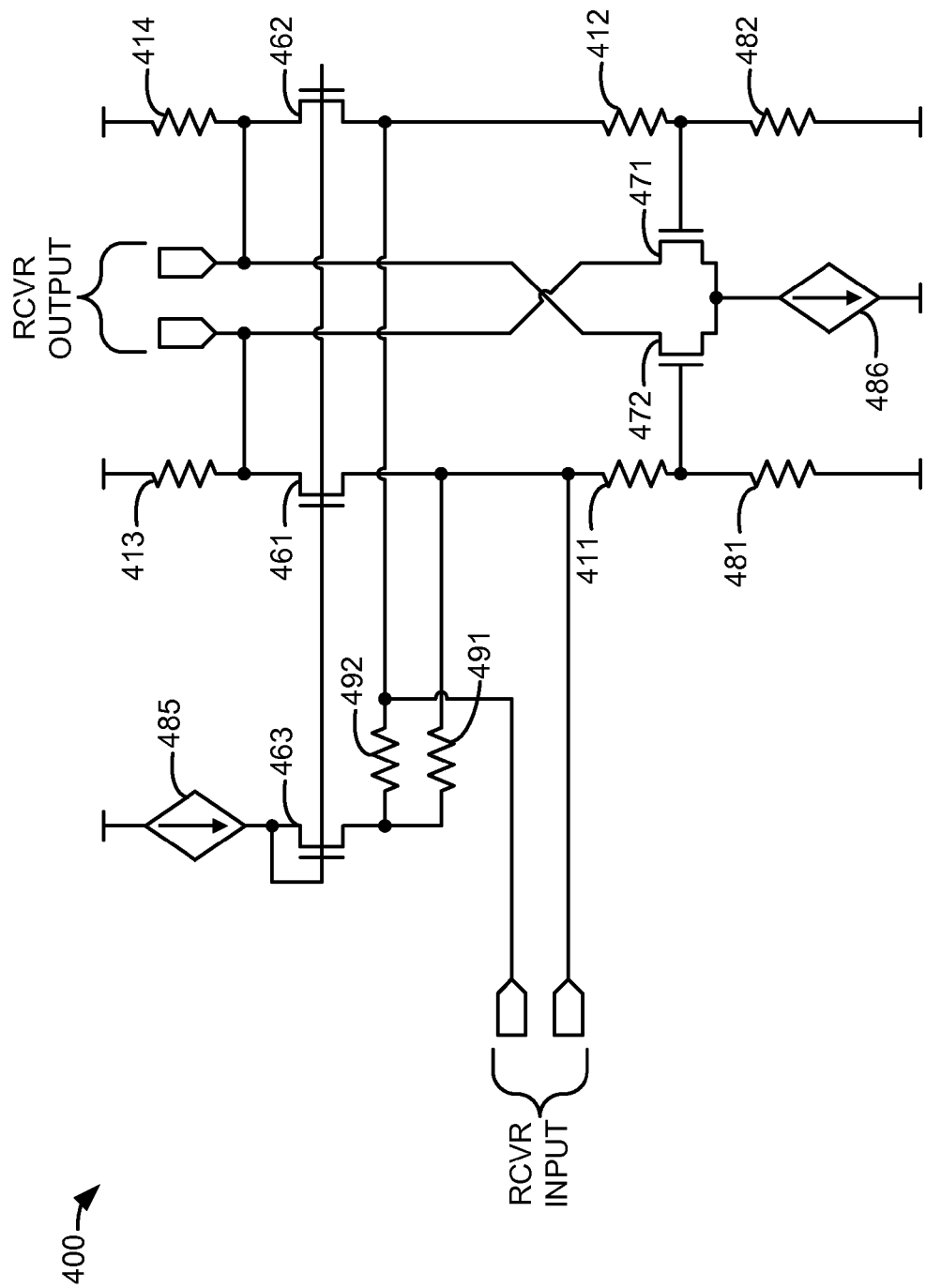
FIG. 4D is a schematic diagram illustrating an equivalent circuit of a reconfigurable receiver in a third configuration.

FIG. 4D is a schematic diagram illustrating the equivalent circuit of reconfigurable receiver 400 when SEL1 and SEL2 are both in a logic high state. In FIG. 4D, the "off" or non-conducting elements of reconfigurable receiver 400 have been removed. With the exception of FET 481 and FET 482, and the "on" FETs have been replaced with short circuits. FET 481 and FET 482 are shown as resistors to reflect their "on" state impedances. Also, because they are not in the active signal path from the receiver input to the receiver output, inverter 487 and inverter 488 are not shown in FIG. 4D. In FIG. 4D, a first terminal of resistor 414 is connected to the positive power supply terminal. The second terminal of resistor 414 is connected to the drain of FET 462 and the drain of FET 472. The source of FET 462 is connected to a first terminal of resistor 412 and a first terminal of termination resistor 492. The second terminal of resistor 412 is connected to the gate of FET 471 and a first terminal of the impedance representing FET 482. The second terminal of resistor 412 is shown connected to a first terminal of the impedance representing FET 482 because FET 482 is on. The second terminal of termination resistor 492 is connected to the source of FET 463. The second terminal of the impedance representing FET 482 is connected to the negative power supply. A first terminal of current source 486 is connected to the source of FET 471 and the source of FET 472. The second terminal of current source 486 is connected to the negative power supply.

A first terminal of resistor 413 is connected to the positive power supply terminal. The second terminal of resistor 413 is connected to the drain of FET 461 and the drain of FET 471. The source of FET 461 is connected to a first terminal of resistor 411 and a first terminal of termination resistor 491. The second terminal of resistor 411 is connected to the gate of FET 472 and a first terminal of the impedance representing FET 481. The second terminal of resistor 411 is shown connected to a first terminal of the impedance representing FET 481 because FET 481 is on. The second terminal of the impedance representing FET 481 is connected to the negative power supply. The second terminal of termination resistor 491 is connected to the source of FET 463. FET 483 is not shown in FIG. 4D because it is off.

Current source 485 is shown conducting a controlled current that is routed through diode-connected FET 463. Thus, the current flowing through current source 485 determines the current flowing through FETs 461 and 462 in a current-mirror-like arrangement. It should be understood from FIG. 4D that in this configuration (i.e., with SEL1 high and SEL2 high), reconfigurable receiver 400 is configured as both a differential common-gate type amplifier and a differential common-source type amplifier that sum their outputs at common nodes (i.e., the drains of FETs 471-472 which are connected to the drains of FETs 461-462, respectively). It should also be understood that the size of FET 463 in relation to the sizes of FET 461 and FET 462 may be selected such that the current flowing through resistor 491 and/or resistor 492 is insignificant when compared to the current flowing through FET 461 and/or FET 462. For example, if the width-to-length ratio of FET 461 and FET 462 are ten (10) times the width-to-length ration of FET 463, the current flowing through FET 463 (and thus resistor 491 and/or resistor 492) would be approximately 10% of the current flowing through either of FET 461 or FET 462.

FIGS. 5A-5D are schematic diagrams illustrating exemplary receiver configurations. In particular, FIGS. 5A-5D are schematic diagrams illustrating exemplary receiver configurations of reconfigurable receiver 5100. Reconfigurable receiver 5100 comprises a first amplifier 5167, which may be a first single-stage amplifier. First amplifier 5167 may be all or part of the active elements of a common-gate differential amplifier. Common-gate differential amplifier 5167 comprises a first differential pair of FETs 5167A, 5167B having a first pair of gate terminals, a first pair of drain terminals, and a first pair of source terminals. First amplifier 5167 further comprises current mirror circuitry 5167C. In an embodiment, current mirror circuitry 5167C comprises a diode-connected FET 5167C. A gate terminal of diode-coupled FET 5167C is connected to the first pair of gate terminals of the first differential pair of FETs 5167A, 5167B. On-die termination 5168 shown in FIGS. 5A-5D comprises a pair of on-die termination resistor loads and a pair of on-die termination selection FETs. The pair of on-die termination resistor loads are connected respectively to the first pair of source terminals of the first differential pair of FETs 5167A, 5167B. A pair of drain-coupled resistor loads 5169A, 5169B are connected between VDD and respectively the first pair of drain terminals of the first differential pair of FETs 5167A, 5167B. Suitable resistive values for the pair of drain-coupled resistor loads 5169A, 5169B may be selected for influencing gain of the common-gate differential amplifier 5167.

Additionally, as shown in FIGS. 5A-5D, reconfigurable receiver 5100 may further comprise a second amplifier 5177. Second amplifier 5177 may be a second single-stage amplifier. Second amplifier 5177 may be all or part of the active elements of a common-source differential amplifier. Second amplifier 5177 comprises a second differential pair of FETs 5177A, 5177B having a second pair of gate terminals, a second pair of drain terminals, and a second pair of source terminals.

Reconfigurable receiver 5100 may further comprise configuration mode selector circuitry comprising 5180A, 5180B, 5180C, 5104A, 5104B. Configuration mode selector circuitry 5180A, 5180B, 5180C, 5104A, 5104B may be coupled to first amplifier 5167 and second amplifier 5177, for selective activation thereof. Selective activation of first amplifier 5167 and second amplifier 5177 may be in response to receiving enabling signals on respective configuration select inputs. In a first configuration, configuration mode selector circuitry 5180A, 5180B, 5180C, 5104A, 5104B may be coupled with the first and second differential pairs of FETs for activating the first differential pair of FETs 5167A, 5167B and deactivating the second pair of FETs 5177A, 5177B. In a second configuration mode, the configuration mode selector circuitry 5180A, 5180B, 5180C, may be coupled with the first and second differential pairs of FETs for deactivating the first differential pair of FETs 5167A, 5167B and activating the second differential pair of FETs 5177A, 5177B.

In FIGS. 5A-5D, configuration mode selector circuitry 5180A, 5180B, 5180C, 5104A, 5104B includes current mirror bias (ibias) 5180A, FET 5180B, common source bias 5180C, FET 5104A, and FET 5104B. In the first configuration, current mirror bias (ibias) 5180A and pull-down FET 5180B couple to first amplifier 5167 for activating the first amplifier 5167. In the second configuration, current mirror bias (ibias) 5180A and pull-down FET 5180B couple to first amplifier 5167 for deactivating the first amplifier 5167. More specifically, the current mirror bias (ibias) 5180A is coupled between VDD and drain/gate of diode-coupled FET 5167C. The conductive path of FET 5180B when it is on couples the gate of the diode-coupled FET 5167C of the current mirror to ground. The common source bias 5180C is coupled between ground and the second pair of source terminals of the second pair of differential pair of FETs 5177A, 5177B.

In the first configuration, in response to receiving the high voltage level on configuration select signal #1, current mirror bias (ibias) 5180A may be activated so as to provide bias to the first differential pair of FETs 5167A, 5167B. At substantially the same time, in response to the high voltage level on configuration select signal #1, the pull-down FET 5180B may be deactivated (i.e. in cutoff), so as to provide for activation of the first differential pair of FETs 5167A, 5167B. Also in response to receiving the high voltage level on configuration select signal #1, FET 5104A and FET 5104B are activated (i.e., in a strong conducting or "on" state). In the first configuration, in response to receiving the low voltage level on configuration select signal #2, common source bias 5180C may be deactivated. These conditions deactivate the second pair of FETs 5177A, 5177B.

Figure 5A:
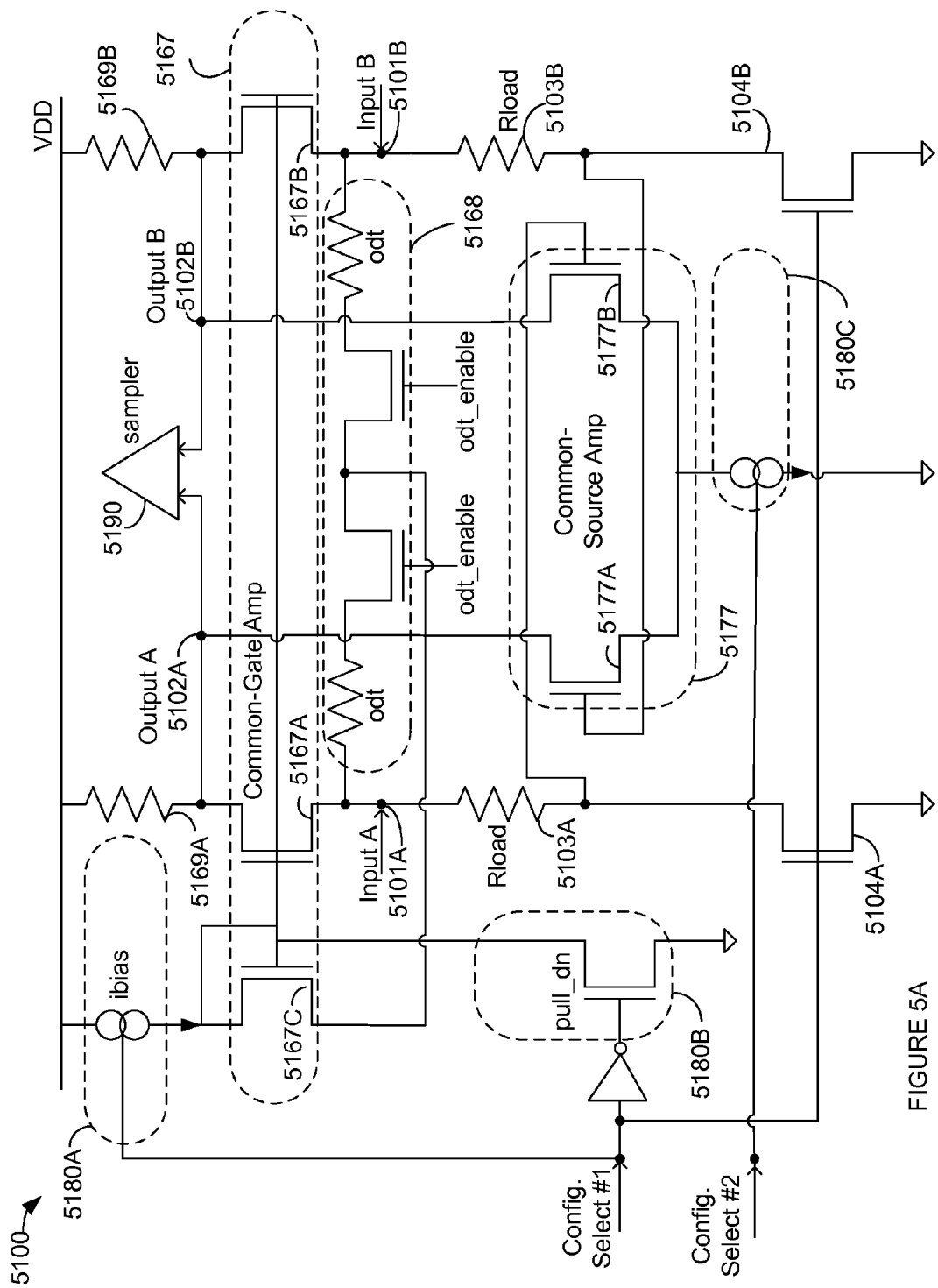
FIGS. 5A-5D are schematic diagrams illustrating exemplary receiver configurations.
Figure 5B:
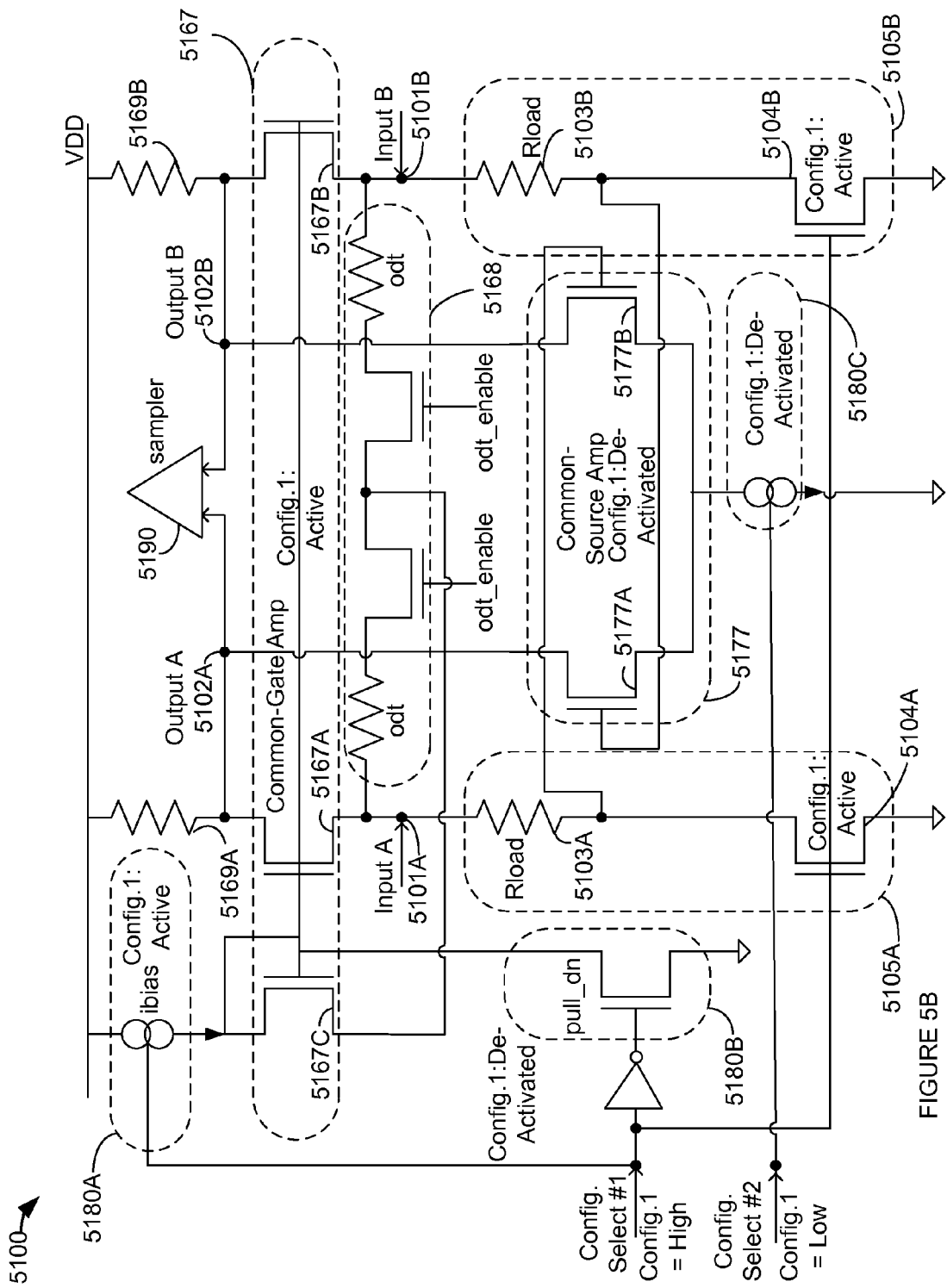

FIG. 5B particular shows the selectively reconfigurable receiver of FIG. 5A, when the configuration select signal #1 is at a high voltage level and configuration select signal #2 is at a low voltage level for selecting the first configuration mode of reconfigurable receiver 5100. In response to the high voltage level of configuration select signal #1 and the low voltage level of configuration select signal #2, the configuration mode selector circuitry 5180A, 5180B, 5180C, 5104A, 5104B may select the first configuration mode of the selectively configurable receiver 5100. When activated in the first configuration, first amplifier 5167 can receive a differential input signal. This differential input signal may be a Near Ground Signaling signal. In response to the differential input signal, reconfigurable receiver 5100 produces a differential output signal. First amplifier 5167 may shift a voltage level of the differential output signal, relative to the Near Ground Signaling input. The Near Ground Signaling signal is received at input nodes 5101A, 5101B of the selectively reconfigurable receiver 5100. A differential output signal is provided at output nodes 5102A, 5102B of reconfigurable receiver 5100. The differential output signal of reconfigurable receiver 5100 is sampled by a sampler 5190 as shown in FIG. 5B.

In response to the first configuration select signal levels, configuration mode selector circuitry 5180A, 5180B, 5180C, 5104A, 5104B may deactivate second amplifier 5176. When deactivated, second amplifier 5176 substantially avoids contributing to the differential output signal at output nodes 5102A, 5102B of reconfigurable receiver 5100.

When the configuration mode selector circuitry 5180A, 5180B, 5180C, 5104A, 5104B selects the first configuration, a first member of the first pair of drain terminals couples a signal to first output node 5102A. Similarly, when the configuration mode selector circuitry 5180A, 5180B, 5180C, 5104A, 5104B selects the first configuration mode, a second member of the first pair of drain terminals couples a signal to second output node 5102B.

When configuration mode selector circuitry 5180A, 5180B, 5180C, 5104A, 5104B selects the first configuration mode, first input node 5101A is connected to a first resistor load 5103A and to the first amplifier 5167 (or more particularly, to a first member of the first pair of source terminals of the first differential pair of FETs 5167A, 5167B.) In other words, when the configuration mode selector circuitry 5180A, 5180B, 5180C, 5104A, 5104B selects the first configuration mode, first resistor load 5103A is connected between the first member of the first pair of transistor source terminals and the negative power supply via FET 5104A. In the first configuration, first amplifier 5167 may have an active voltage gain driven by a voltage drop in the first resistor load 5103A and FET 5104A, Similarly, when the configuration mode selector circuitry 5180A, 5180B, 5180C, 5104A, 5104B selects the first configuration mode, second input node 5101B is connected to a second resistor load 5103B and to the first amplifier 5167 (or more particularly, to a second member of the first pair of source terminals of the first differential pair of FETs 5167A, 5167B.) In other words, when the configuration mode selector circuitry 5180A, 5180B, 5180C, 5104A, 5104B selects the first configuration mode, second resistor load 5103B is connected between a second member of the first pair of transistor source terminals and the negative power supply via ET 5104B. In the first configuration mode, the first amplifier 5167 may have an active voltage gain driven by a voltage drop in the second resistor load 5103B and FET 5104B. First and second resistor loads 5103A, 5103B may have substantially equal resistance. The on resistance of FETs 5104A and 5104B may be substantially equal.

When the configuration mode selector circuitry 5180A, 5180B, 5180C, 5104A, 5104B selects the first configuration, first input node 5101A is connected to a first low impedance input path through the first resistor load 5103A to the negative power supply via FET 5104A. Second input node 5101B is connected to a second low impedance input path through the second resistor load 5103B to the negative power supply via FET 5104B. Moreover, when the configuration mode selector circuitry 5180A, 5180B, 5180C, 5104A, 5104B selects the first configuration mode, first input node 5101A couples a signal to a first member of the first pair of transistor source terminals and second input node 5101B couples a signal to a second member of the first pair of transistor source terminals. A dashed line oval surrounding first load resistor 5103A and FET 5104A in FIG. 5B particularly highlights the first low impedance input path 5105A, which may extend through first load resistor 5103A and FET 5104A to the negative power supply, in the first configuration mode. A dashed line oval surrounding second load resistor 5103B and FET 5104B in FIG. 5B particularly highlights the second low impedance input path 5105B, which may extend through second load resistor 5103B and FET 5104BA to the negative power supply, in the first configuration mode.

Figure 5C:
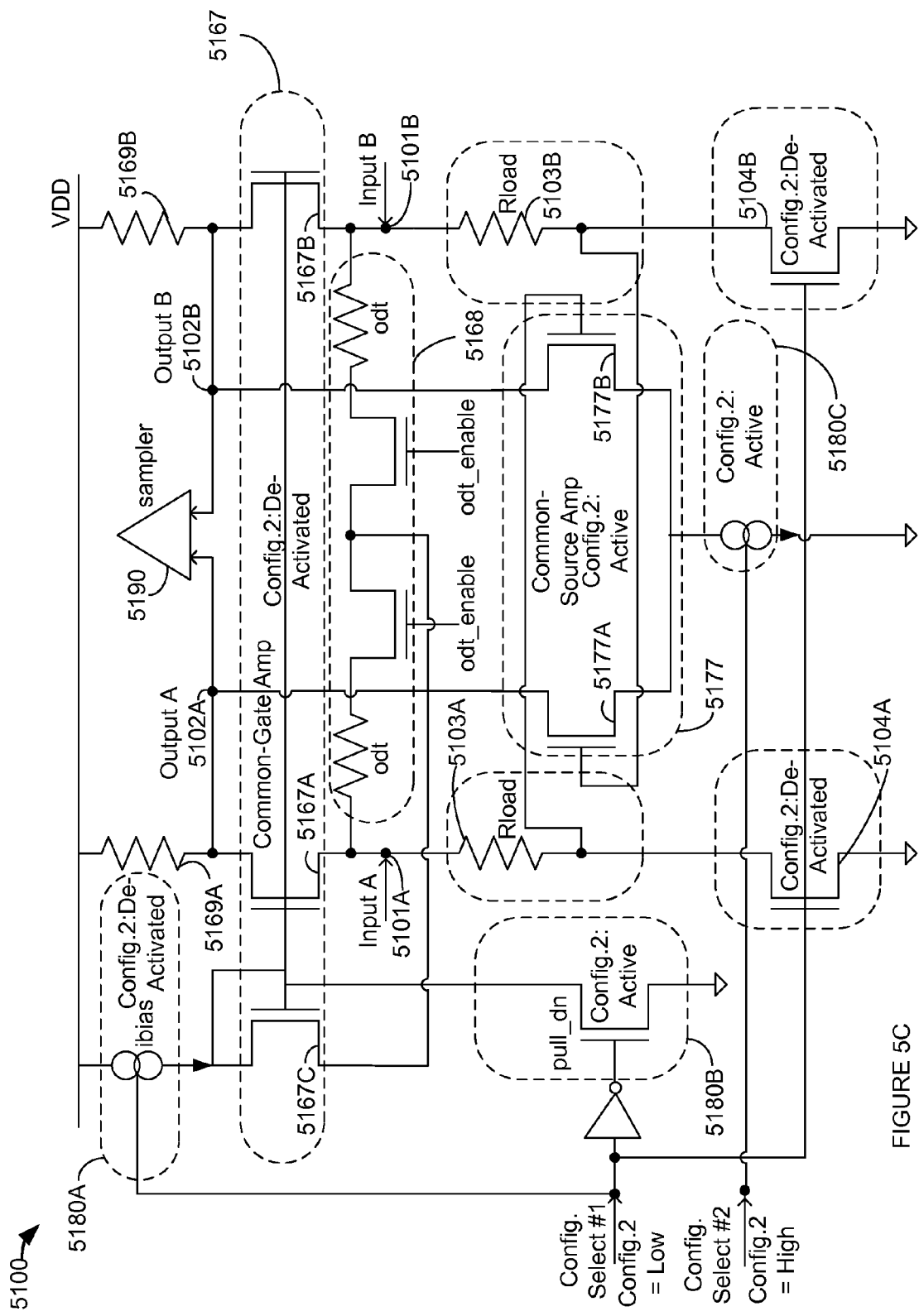

FIG. 5C particularly shows the reconfigurable receiver of FIG. 5A, when the configuration select signals are at a second configuration select signal levels. The second configuration select signal levels select the second configuration of reconfigurable receiver 5100. The second configuration select signal levels may be a low voltage level on configuration select signal #1 and a high voltage level on configuration select signal #2. In response to low voltage level on configuration select signal #1 and a high voltage level on configuration select signal #2, the configuration mode selector circuitry 5180A, 5180B, 5180C, 5104A, 5104B may select the second configuration of reconfigurable receiver 5100. In the second configuration mode, in response to receiving the low voltage level of the configuration select signal #1, current mirror bias (ibias) 5180A is deactivated to cut-off bias to the first differential pair of FETs 5167A, 5167B. Also in response to the low voltage level of configuration select signal #1, FETs 5104A and 5104B are deactivated (i.e. in cutoff). At substantially the same time, in response to the low voltage level of the configuration select signal #1, the pull-down FET 5180B is activated to pull-down the first pair of gates, which deactivates the first differential pair of FETs 5167A, 5167B. In the second configuration mode, in response to receiving the high voltage level of the configuration select signal #2, common source bias 5180C is activated, which activates the second differential pair of FETs 5177A, 5177B.

When activated in the second configuration mode, second amplifier 5177 can receive a differential input signal. This differential input signal may be a near-VDD signaling signal. In response to the differential input signal, reconfigurable receiver 5100 produces a differential output signal. Second amplifier 5177 may shift a voltage level of the differential output signal, relative to the near-VDD signaling input. The near-VDD signaling signal is received at input nodes 5101A, 5101B of reconfigurable receiver 5100. The differential output signal is provided at output nodes 5102A, 5102B of reconfigurable receiver 5100. The differential output signal of reconfigurable receiver 5100 is sampled by the sampler 5190 as shown in FIG. 5C.

In response to the low voltage level of the configuration select signal, the configuration mode selection circuitry (or, more particularly, current mirror bias (ibias) 5180A and FET 5180B) deactivate the first amplifier 5167. When deactivated, the first amplifier 5167 substantially avoids contributing to the differential output signal at output nodes 5102A, 5102B of reconfigurable receiver 5100.

When configuration mode selector circuitry 5180A, 5180B, 5180C, 5104A, 5104B selects the second configuration, a first member of the second pair of drain terminals couples a signal to first output node 5102A. Similarly, when the configuration mode selector circuitry 5180A, 5180B, 5180C, 5104A, 5104B selects the second configuration, a second member of the second pair of drain terminals couples a signal to second output node 5102B.

When the configuration mode selector circuitry 5180A, 5180B, 5180C, 5104A, 5104B selects the second configuration mode, a signal from first input node 5101A is coupled to a first member of the second pair of gate terminals of the second differential pair of FETs 5177A, 5177B. When the configuration mode selector circuitry 5180A, 5180B, 5180C, 5104A, 5104B selects the second configuration mode, a signal from the second input node 5101B is coupled to a second member of the second pair of gate terminals of the second differential pair of FETs 5177A, 5177B.

Figure 5D:
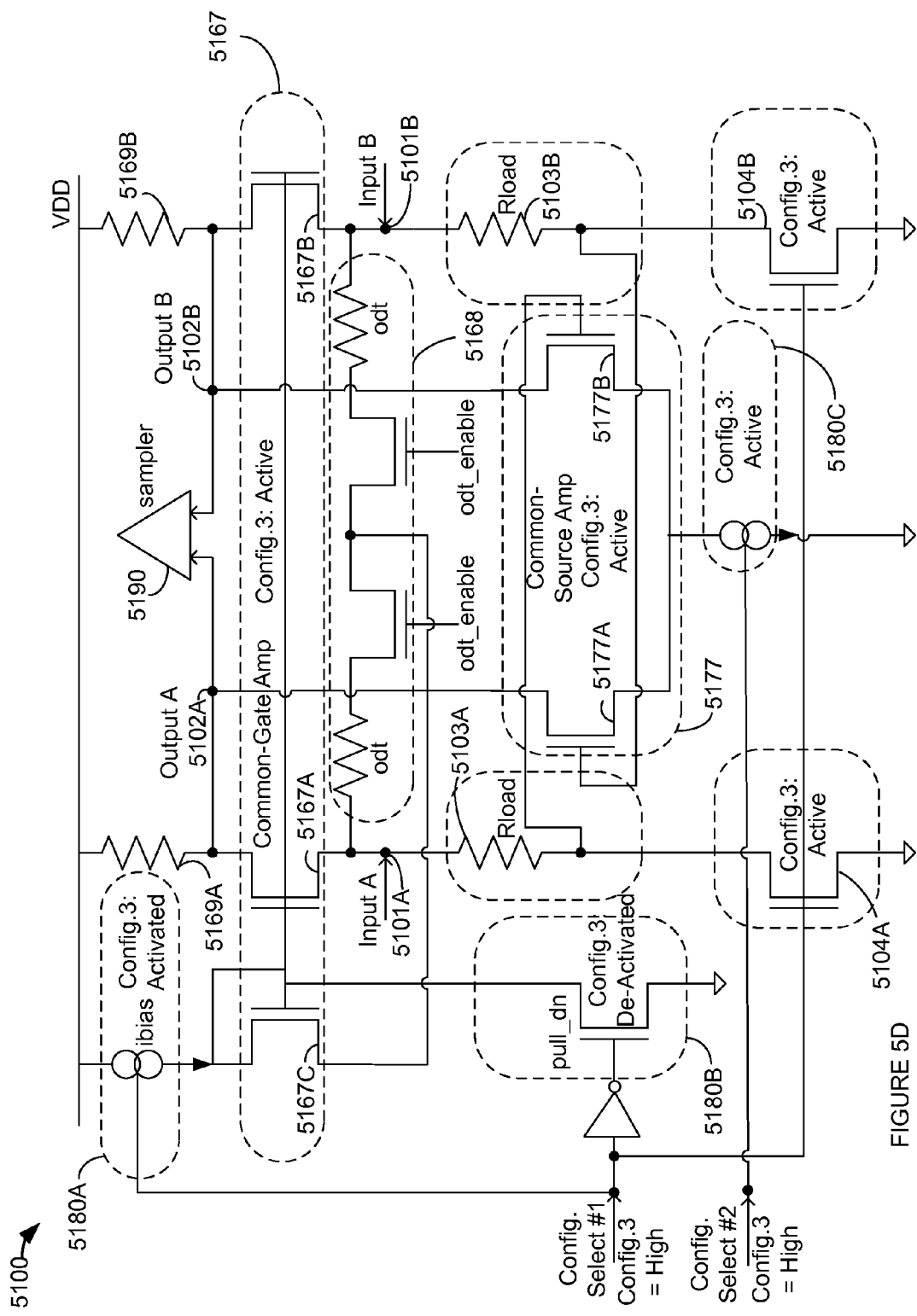

FIG. 5D particularly shows the reconfigurable receiver of FIG. 5A, when the configuration select signals are at a third configuration select signal levels. The third configuration select signal levels select the third configuration of reconfigurable receiver 5100. The third configuration select signal levels may be a high voltage level on configuration select signal #1 and a high voltage level on configuration select signal #2. In response to high voltage level on configuration select signal #1 and a high voltage level on configuration select signal #2, the configuration mode selector circuitry 5180A, 5180B, 5180C, 5104A, 5104B may select the third configuration of reconfigurable receiver 5100. In the third configuration mode, in response to receiving the high voltage level of the configuration select signal #1, current mirror bias (ibias) 5180A is activated to bias to the first differential pair of FETs 5167A, 5167B. In response to receiving the high voltage level of the configuration select signal #1, FETs 5104A and 5104B are activated. At substantially the same time, in response to the high voltage level of the configuration select signal #1, the pull-down FET 5180B is deactivated to allow the first differential pair of FETs 5167A, 5167B to operate. In the third configuration mode, in response to receiving the high voltage level of the configuration select signal #2, common source bias 5180C is activated, which activates the second differential pair of FETs 5177A, 5177B.

When activated in the third configuration mode, both the first amplifier 5167 and the second amplifier 5177 can receive a differential input signal. This differential input signal may be a near-VDD signaling signal or a Near ground signaling signal. In response to the differential input signal, reconfigurable receiver 5100 produces a differential output signal. The near-VDD signaling signal or Near ground signaling signal is received at input nodes 5101A, 5101B of reconfigurable receiver 5100. The differential output signal is provided at output nodes 5102A, 5102B of reconfigurable receiver 5100. The differential output signal of reconfigurable receiver 5100 is sampled by the sampler 5190 as shown in FIG. 5D.

In other words, FIGS. 5A-5D can be understood as showing reconfigurable receiver 5100 alternatively choosing between first, second, and third compositions of circuitry sets. Reconfigurable receiver 5100 may comprise a first circuitry set 5180A, 5180B that enables first amplifier 5167 to be active between input nodes 5101A, 5101B and output nodes 5102A, 5102B, when the first composition 5101A, 5101B, 5167, 5102A, 5102B, 5103A, 5103B, 5169A, 5169B of circuitry sets is chosen. When the second composition 5101A, 5101B, 5177, 5102A, 5102B, 5169A, 5169B, 5103A, 5103B of circuitry sets is chosen, the first circuitry set 5180A, 5180B disables the first amplifier 5167 from being active between the input nodes 5101A, 5101B and the output nodes 5102A, 5102B. When the third composition 5101A, 5101B, 5177, 5102A, 5102B, 5169A, 5169B, 5103A, 5103B, 5180A, 5180B, 5167 of circuitry sets is chosen, both the first amplifier 5167 and the second amplifier 5177 are active between the input nodes 5101A, 5101B and the output nodes 5102A, 5102B.

Reconfigurable receiver 5100 may further comprise second circuitry set 5180C, 5104A, 5104B for enabling second amplifier 5177 to be active between the input nodes 5101A, 5101B and the output nodes 5102A, 5102B, when the second composition 5101A, 5101B, 5177, 5102A, 5180C, 5102B, 5169A, 5159B of circuitry sets is chosen. When the second composition 5101A, 5101B, 5177, 5102A, 5180C, 5102B, 5169A, 5159B of circuitry sets is chosen, second circuitry set 5180C, 5104A, 5104B disables the second amplifier 5177 from being active between the input nodes 5101A, 5101B and the output nodes 5102A, 5102B.

In the first configuration, the first amplifier 5167 may shift a Near Ground Signaling signal at the system input nodes 5101A, 5101B to a system output signal at the output nodes 5102A, 5102B by a first voltage level amount (both common-mode and differential). In the second configuration, the second amplifier 5177 may shift a near-VDD signaling signal at the system input nodes 5101A, 5101B to an output signal at the output nodes 5102A, 5102B by a second voltage amount (both common-mode and differential). The second voltage amount may be substantially greater than the first voltage level amount. In other words, although the Near Ground Signaling signal gets shifted by the first voltage level amount for the output in the first configuration, and the near-VDD signaling signal gets shifted by the second voltage level amount for the output in the second configuration, the near-VDD signaling signal may get shifted more in the second configuration than what the Near Ground Signaling (NGS) signal gets shifted in the first configuration. Accordingly, the second voltage level amount of the shift in the second configuration may be substantially greater than the first voltage level amount of the shift in the first configuration.

Figure 6A:
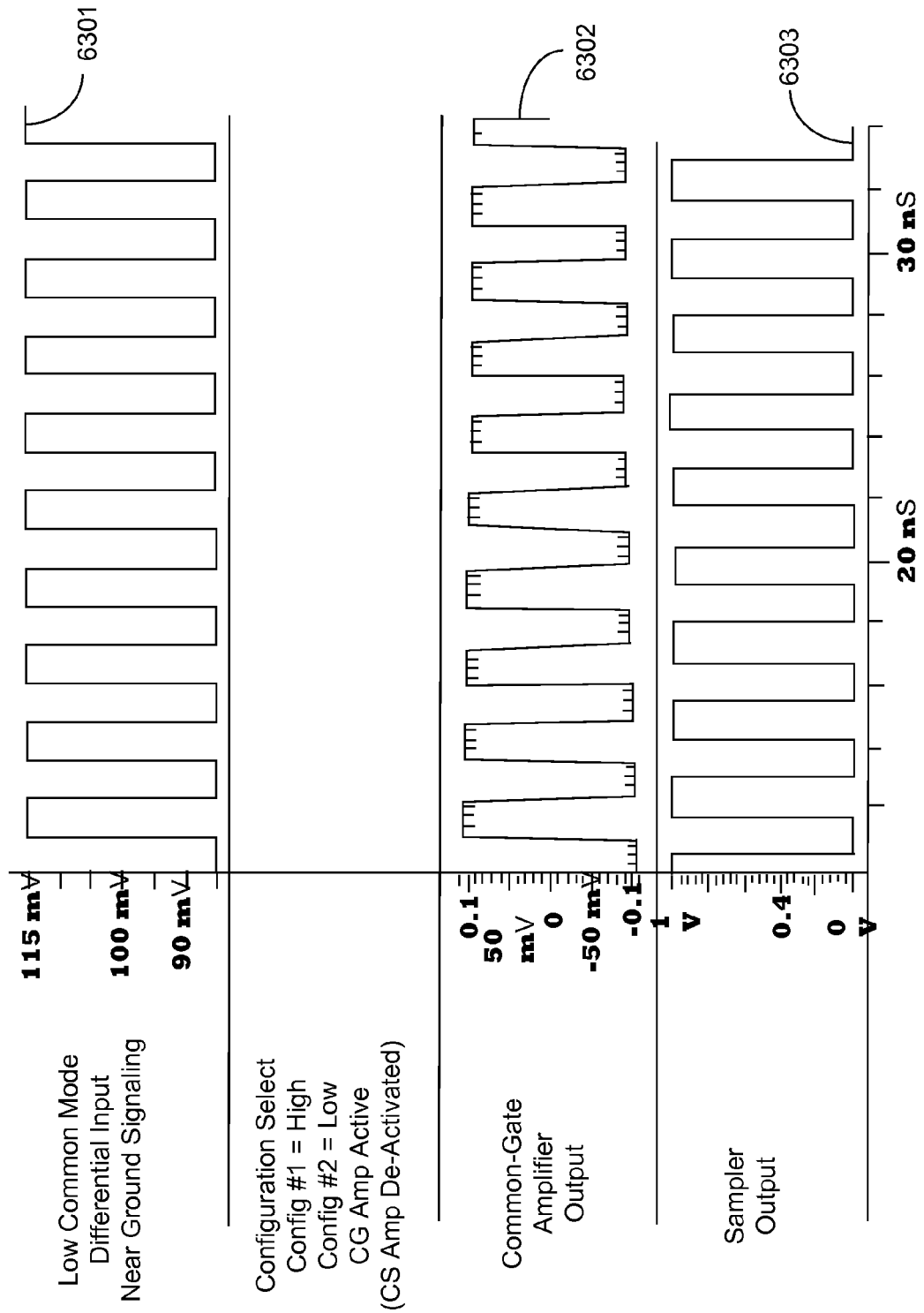
FIGS. 6A and 6B are simulation timing diagrams corresponding to the exemplary receiver configurations.
Figure 6B:
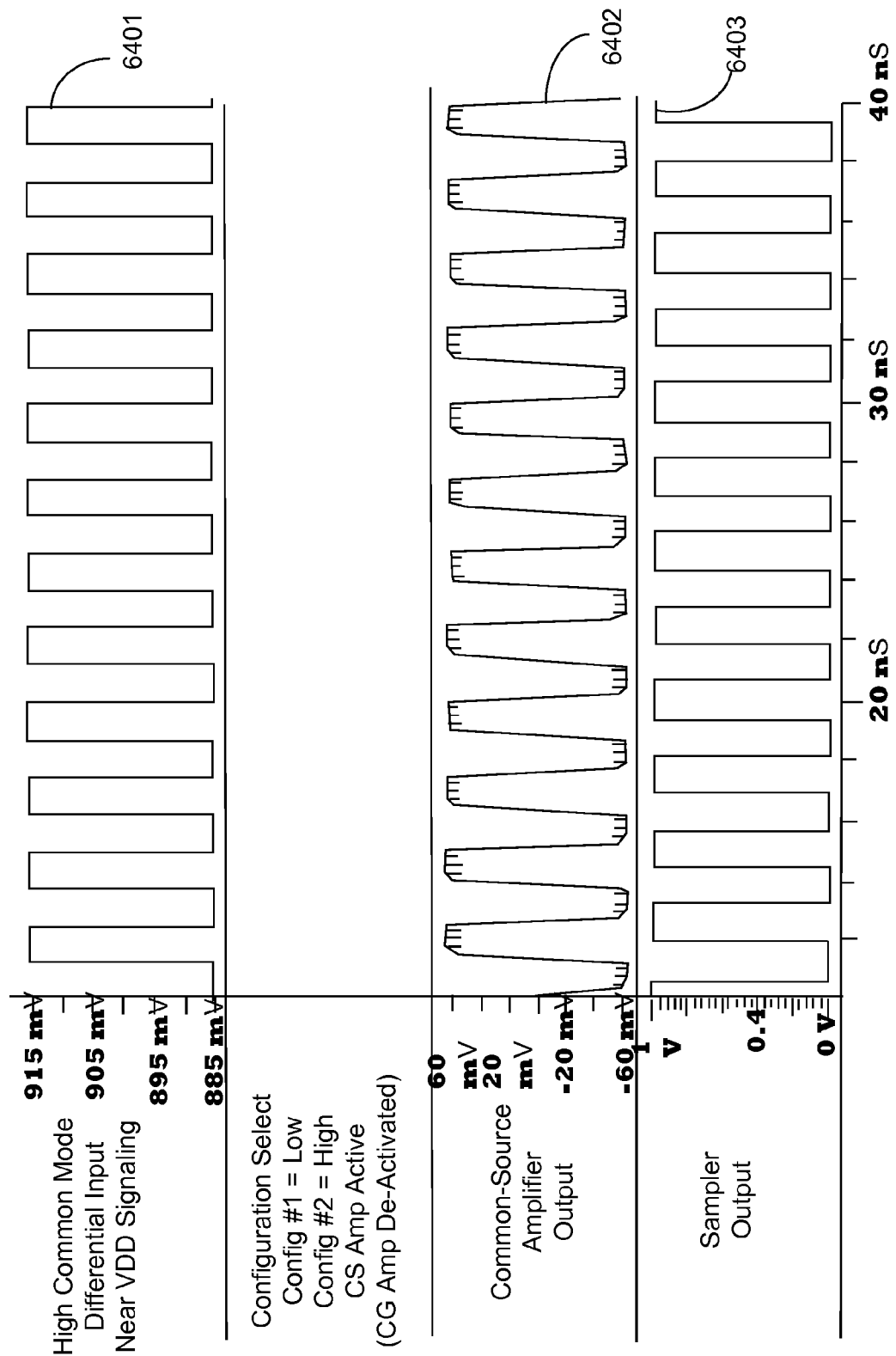

FIGS. 6A and 6B are simulation timing diagrams corresponding to the exemplary receiver configurations. The simulation shown in FIG. 6A illustrates an example of how a reconfigurable receiver 1100, 2100, 3100, 400, or 5100 (discussed previously) may operate in the first configuration mode. In the first configuration mode (i.e., when configuration select signal #1 is a logic high and configuration select signal #2 is a logic low), the input to a reconfigurable receiver 1100, 2100, 3100, 400, or 5100 may be the Near Ground Signaling signal. The NGS input may have the near ground, low voltage swing between approximately eighty-five millivolts (85 mV) and approximately one-hundred and fifteen millivolts (115 mV), as shown first timing trace 6301 in FIG. 6A. The Near Ground Signaling signal may provide a low common-mode voltage as discussed previously herein, for example, of approximately one-hundred millivolts (100 mV) as shown in the first timing trace 6301 of FIG. 6A.

As discussed previously herein, a reconfigurable receiver 1100, 2100, 3100, 400, or 5100 may have a common-gate amplifier configuration (CG Amp.). The common-gate amplifier may be activated in the first configuration mode of a reconfigurable receiver 1100, 2100, 3100, 400, or 5100. A reconfigurable receiver 1100, 2100, 3100, 400, or 5100 also may have a common-source amplifier configuration (CS Amp.). The common-source amplifier may be deactivated in the first configuration mode of a reconfigurable receiver 1100, 2100, 3100, 400, or 5100.

The second timing trace 6302 illustrates an output of the common-gate amplifier, when the common-gate amplifier may be activated, and a reconfigurable receiver 1100, 2100, 3100, 400, or 5100 is in the first configuration mode. As mentioned previously, and as shown in further detail in FIG. 6A, when the common-gate amplifier is activated in the first configuration mode, the common-gate amplifier may shift the received Near Ground Signaling signal by the first voltage level amount, so as to produce the output of the common-gate amplifier. This is illustrated in the second timing trace 6302 of FIG. 6A. The received Near Ground Signaling signal may be shifted by the first voltage level amount, so that the output of the common-gate amplifier may swing between approximately negative one-hundred millivolts (−100 mV) and approximately positive one hundred millivolts (100 mV), as shown in the second timing trace 6302 of FIG. 6A. When a reconfigurable receiver 1100, 2100, 3100, 400, or 5100 is in the first configuration, a sampler may receive the output of the activated common-gate amplifier, and may produce a sampler output as illustrated by the third timing trace 6303 shown in FIG. 6A.

The simulation shown in FIG. 6B illustrates how a reconfigurable receiver 1100, 2100, 3100, 400, or 5100 may operate in the second configuration mode (i.e., when configuration select signal #1 is a logic low and configuration select signal #2 is a logic high). In the second configuration mode, the input to a reconfigurable receiver 1100, 2100, 3100, 400, or 5100 may be a near-VDD signaling signal, which may swing between approximately eight-hundred-and-eighty-five millivolts (885 mV) and approximately nine-hundred-and-fifteen millivolts (915 mV) as shown by a first timing trace 6401 in FIG. 6B. The near-VDD signaling signal may provide a high common-mode voltage as discussed previously herein, of approximately nine-hundred millivolts (900 mV), as shown in the first timing trace 6401 of FIG. 6B.

As discussed previously herein, a reconfigurable receiver 1100, 2100, 3100, 400, or 5100 may have a common-source amplifier. The common-source amplifier may be activated in the second configuration mode of a reconfigurable receiver 1100, 2100, 3100, 400, or 5100. A reconfigurable receiver 1100, 2100, 3100, 400, or 5100 also may have a common-gate amplifier. The common-gate amplifier may be deactivated in the second configuration mode of a reconfigurable receiver 1100, 2100, 3100, 400, or 5100.

The second timing trace 6402 illustrates an output of the common-source amplifier, when the common-source amplifier may be activated, and a reconfigurable receiver 1100, 2100, 3100, 400, or 5100 is in the second configuration mode. As mentioned previously, and as shown in further detail in FIG. 6B, when the common-source amplifier is activated in the second configuration mode, the common-source amplifier may shift the received near-VDD signaling signal by the second voltage level amount, so as to produce the output of the common-source amplifier. The output of the common-source amplifier is illustrated in the second timing trace 6402 of FIG. 6B. The received near-VDD signaling signal may be shifted by a second voltage level amount, so that the output of the common-source amplifier may swing between approximately negative sixty millivolts (−60 mV) and approximately positive sixty millivolts (60 mV), as shown in the second timing trace 6402 of FIG. 6B. When a reconfigurable receiver 1100, 2100, 3100, 400, or 5100 is in the second configuration, a sampler may receive the output of the activated common-source amplifier, and may produce a sampler output as illustrated by the third timing trace 6403 shown in FIG. 6B.

By making a careful visual comparison of FIG. 6B and FIG. 6A, it can be seen that in the second configuration, the activated common-source amplifier may shift the near-VDD signaling signal (see trace 6401 in FIG. 6B) to the output signal (see trace 6402 in FIG. 6B) by a second voltage amount, which may be substantially greater than the first voltage level amount, by which the activated common-gate amplifier may shift a Near Ground Signaling signal (see trace 6301 in FIG. 6A) in the first configuration to the output signal (see trace 6302 in FIG. 6A). In other words, although a Near Ground Signaling signal gets shifted by the first voltage level amount for the output in the first configuration, and a near-VDD signaling signal gets shifted by the second voltage level amount for the output in the second configuration, careful visual comparison of FIG. 6B and FIG. 6A shows that the near-VDD signaling signal may get shifted more in the second configuration than what the Near Ground Signaling signal gets shifted in the first configuration. Accordingly, the second voltage level amount of the shift in the second configuration may be substantially greater than the first voltage level amount of the shift in the first configuration.

Figure 7:
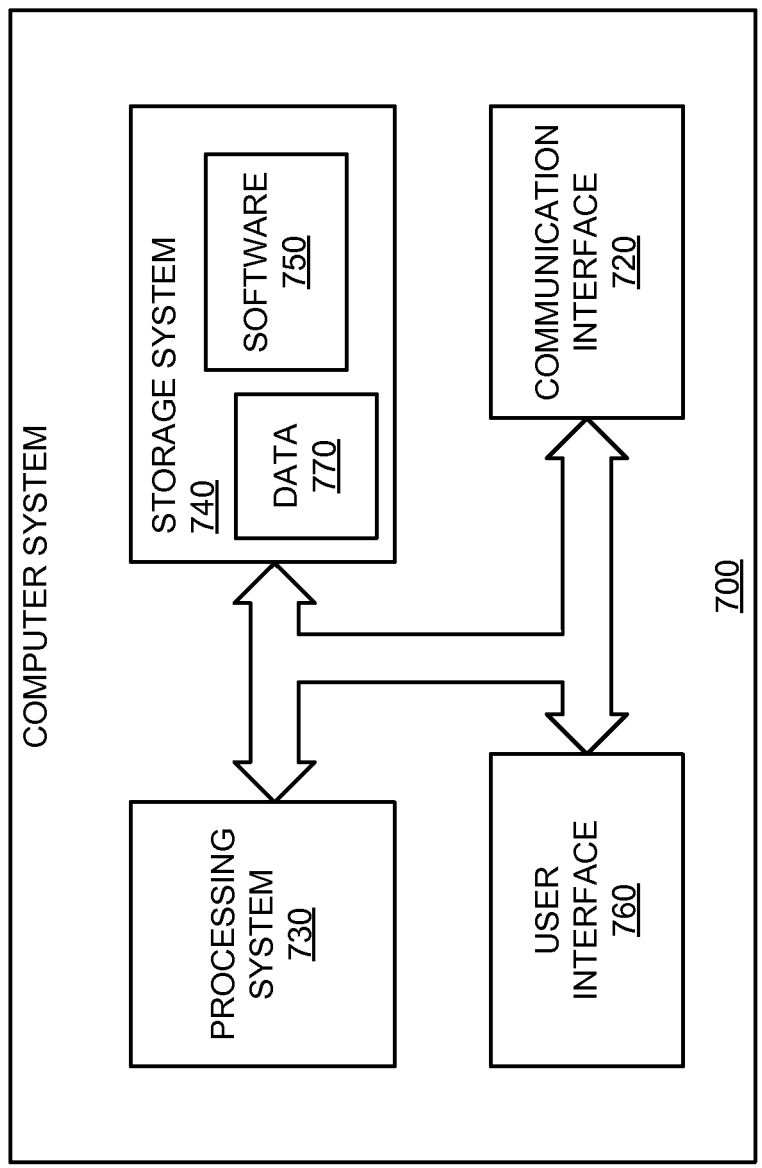
FIG. 7 illustrates a block diagram of a computer system.

FIG. 7 illustrates a block diagram of a computer system. Computer system 700 includes communication interface 720, processing system 730, storage system 740, and user interface 760. Processing system 730 is operatively coupled to storage system 740. Storage system 740 stores software 750 and data 770. Computer system 700 may include one or more of reconfigurable receivers 1100, 2100, 3100, 400, or 5100. Processing system 730 is operatively coupled to communication interface 720 and user interface 760. Computer system 700 may comprise a programmed general-purpose computer. Computer system 700 may include a microprocessor. Computer system 700 may comprise programmable or special purpose circuitry. Computer system 700 may be distributed among multiple devices, processors, storage, and/or interfaces that together comprise elements 720-770.

Communication interface 720 may comprise a network interface, modem, port, bus, link, transceiver, or other communication device. Communication interface 720 may be distributed among multiple communication devices. Processing system 730 may comprise a microprocessor, microcontroller, logic circuit, or other processing device. Processing system 730 may be distributed among multiple processing devices. User interface 760 may comprise a keyboard, mouse, voice recognition interface, microphone and speakers, graphical display, touch screen, or other type of user interface device. User interface 760 may be distributed among multiple interface devices. Storage system 740 may comprise a disk, tape, integrated circuit, RAM, ROM, EEPROM, flash memory, network storage, server, or other memory function. Storage system 740 may include computer readable medium. Storage system 740 may be distributed among multiple memory devices.

Processing system 730 retrieves and executes software 750 from storage system 740. Processing system 730 may retrieve and store data 770. Processing system 730 may also retrieve and store data via communication interface 720. Processing system 730 may create or modify software 750 or data 770 to achieve a tangible result. Processing system 730 may control communication interface 720 or user interface 760 to achieve a tangible result. Processing system 730 may retrieve and execute remotely stored software via communication interface 720.

Software 750 and remotely stored software may comprise an operating system, utilities, drivers, networking software, and other software typically executed by a computer system. Software 750 may comprise an application program, applet, firmware, or other form of machine-readable processing instructions typically executed by a computer system. When executed by processing system 730, software 750 or remotely stored software may direct computer system 700 to operate.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A receiver that is selectively reconfigurable, comprising:
   a first input to couple to, in a first selectable configuration of the receiver, a resistor load and a source terminal of a first transistor that is part of a first differential pair of field-effect transistors (FETs) of a first amplifier of the receiver; and
   the first input to couple to, in a second selectable configuration of the receiver, a gate terminal of a second transistor that is part of a second differential pair of FETs of a second amplifier of the receiver;
   mode selector circuitry coupled with the first differential pair of FETs and the second differential pairs of FETs for, in the first selectable configuration of the receiver, activating the first differential pair of FETs and deactivating the second differential pair of FETs, and for, in the second selectable configuration, deactivating the first differential pair of FETs and activating the second differential pair of FETs.

2. The receiver of claim 1, wherein the first input is to receive a differential signaling signal.

3. The receiver of claim 1, wherein the first input is to receive a single-ended signaling signal.

4. The receiver of claim 1, wherein the first input is to receive a differential signaling signal based on a single-ended signaling signal and a reference signal.

5. The receiver of claim 1, wherein the first input is to, in a third selectable configuration of the receiver, both couple to the resistor load and the source terminal of the first transistor that is part of the first differential pair of field-effect transistors (FETs) of the first amplifier of the receiver and the first input is to couple to the gate terminal of the second transistor that is part of the second differential pair of FETs of the second amplifier of the receiver.

6. The receiver of claim 1, further comprising:
   a configuration selector coupled with the first amplifier and the second amplifier for activating the first amplifier and deactivating the second amplifier in the first selectable configuration of the receiver, and for deactivating the first amplifier and activating the second amplifier in the second selectable configuration of the receiver.

7. The receiver of claim 1, wherein:
   the first amplifier comprises current mirror circuitry; and
   the receiver further comprises a configuration selector coupled with the current mirror circuitry for activating the current mirror circuitry in the first selectable configuration of the receiver, and deactivating the current mirror circuitry in the second selectable configuration of the receiver.

8. The receiver of claim 1 wherein:
   the second amplifier comprises a common source amplifier; and
   the receiver further comprises a configuration selector coupled with the common source amplifier for deactivating the common source amplifier in the first selectable configuration of the receiver, and activating the common source amplifier in the second selectable configuration of the receiver.

9. An integrated circuit comprising:
   a first differential pair of field-effect transistors (FETs) having a first pair of gate terminals, a first pair of drain terminals, and a first pair of source terminals, the first differential pair arranged in a common-gate configuration;
   a second differential pair of FETs having a second pair of gate terminals, a second pair of drain terminals, and a second pair of source terminals, the second differential pair arranged in a common-source configuration, the common gate configuration and the common source configuration sharing a common input; and,
   mode selector circuitry coupled with the first differential pair of FETs and the second differential pairs of FETs for, in a first mode, activating the first differential pair of FETs and deactivating the second differential pair of FETs, and for, in a second mode, deactivating the first differential pair of FETs and activating the second differential pair of FETs.

10. The integrated circuit of claim 9, further comprising:
    a first input node, of the common input, to couple, when the mode selector circuitry selects the first mode, to a first resistor load and a first member of the first pair of source terminals, and to couple, when the mode selector circuitry selects the second mode, to a first member of the second pair of gate terminals.

11. The integrated circuit of claim 9 further comprising:
    a first input node to couple, when the mode selector circuitry selects the first mode, to a first resistor load and a first member of the first pair of source terminals; and
    a second input node to couple, when the mode selector circuitry selects the first mode, to a second resistor load and a second member of the first pair of source terminals, the first and second resistor loads to have substantially equal resistance.

12. The integrated circuit of claim 9, further comprising:
a first resistor load to couple, when the mode selector circuitry selects the first mode, to the first member of the first pair of transistor source terminals;
a first input node to have, when the mode selector circuitry selects the first mode, a low impedance input path through the first resistor load;
a second resistor load to couple, when the mode selector circuitry selects the first mode, to a second member of the first pair of transistor source terminals; and
a second input node to have, when the mode selector circuitry selects the first mode, a low impedance input path through the second resistor load.

13. The integrated circuit of claim 9, further comprising:
a first load FET to couple, when the mode selector circuitry selects the first mode, to the first member of the first pair of transistor source terminals, the first load FET to activate in the first mode, and the first input node to have, in the first mode, a low impedance input path through the first load FET; and,
a second load FET to couple, when the mode selector circuitry selects the first mode, to a second member of the first pair of transistor source terminals, the second load FET to activate in the first mode, and the second input node to have, in the first mode, a low impedance input path through the second load FET.

14. The integrated circuit of claim 9, wherein:
the mode selector circuitry comprises a first bias source;
the first bias source is activated in the first mode and is deactivated in the second mode; and,
the first bias source is coupled with the first pair of gate terminals of the first differential pair of FETs to activate the first differential pair of FETs in the first mode, and to deactivate the first differential pair of FETs in the second mode.

15. The integrated circuit of claim 9, wherein:
the mode selector circuitry comprises a pull-down FET;
the pull-down FET is to deactivate in the first mode and to activate in the second mode; and,
the pull-down FET is coupled with the first pair of gate terminals of the first differential pair of FETs to activate the first differential pair of FET's in the first mode, and to deactivate the first differential pair of FET's in the second mode.

16. Differential signal transmission circuitry that is selectively configurable in a plurality of configurations, comprising:
low common-mode differential amplifier circuitry comprising a first differential pair of transistors;
high common-mode differential amplifier circuitry comprising a second differential pair transistors; and,
a differential input to couple to, in a first configuration of the differential signal transmission circuitry, the first differential pair of transistors of the low common-mode differential amplifier circuitry, and to couple to, in a second configuration of the differential signal transmission circuitry, the second differential pair transistors of the high common-mode differential amplifier circuitry;
mode selector circuitry coupled with the first differential pair of transistors and the second differential pairs of transistors for, in the first selectable configuration of the receiver, activating the first differential pair of transistors and deactivating the second differential pair of transistors, and for, in the second selectable configuration, deactivating the first differential pair of transistors and activating the second differential pair of transistors.

17. The differential signal transmission circuitry of claim 16, further comprising:
a differential output to couple, when the differential signal transmission circuitry is in the first configuration, to level shifting circuitry of the low common-mode differential amplifier circuitry; and to couple, when the differential signal transmission circuitry is in the second configuration, to level shifting circuitry of the high common-mode differential amplifier circuitry.

18. The differential signal transmission circuitry of claim 16, further comprising:
configuration selector circuitry coupled with the low common-mode differential amplifier circuitry and the high common-mode differential amplifier circuitry to, when the differential signal transmission circuitry is in the first configuration, activate the low common-mode differential amplifier circuitry and deactivate the high common-mode differential amplifier circuitry, and to, when the differential signal transmission circuitry is in the second configuration, deactivate the low common-mode differential amplifier circuitry and activate the low common-mode differential amplifier circuitry.

19. The differential signal transmission circuitry of claim 16, wherein the low common-mode differential amplifier circuitry is a first single-stage differential amplifier circuitry.

20. The differential signal transmission circuitry of claim 16, wherein the high common-mode differential amplifier circuitry is a second single-stage differential amplifier circuitry.

* * * * *